US012666801B2

(12) United States Patent
Kishimoto et al.

(10) Patent No.: US 12,666,801 B2
(45) Date of Patent: Jun. 23, 2026

(54) DEVICE

(71) Applicant: SAMSUNG ELECTRONICS CO., LTD., Suwon-si (KR)

(72) Inventors: Tadashi Kishimoto, Tokyo (JP); Atsuko Noya, Tokyo (JP); Julian Burschka, Darmstadt (DE); Teruaki Suzuki, Tokyo (JP); Daishi Yokoyama, Tokyo (JP); Seishi Shibayama, Tokyo (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 369 days.

(21) Appl. No.: 18/024,574

(22) PCT Filed: Sep. 1, 2021

(86) PCT No.: PCT/EP2021/074076
§ 371 (c)(1),
(2) Date: Mar. 3, 2023

(87) PCT Pub. No.: WO2022/049096
PCT Pub. Date: Mar. 10, 2022

(65) Prior Publication Data
US 2023/0320140 A1 Oct. 5, 2023

(30) Foreign Application Priority Data
Sep. 4, 2020 (EP) .................................... 20194574

(51) Int. Cl.
*H10K 59/122* (2023.01)
*C09K 11/06* (2006.01)
(Continued)

(52) U.S. Cl.
CPC ............ *H10K 59/122* (2023.02); *C09K 11/06* (2013.01); *H10K 59/1201* (2023.02); *H10K 59/35* (2023.02); *H10K 59/38* (2023.02); *H10K 59/70* (2023.02); *H10K 59/877* (2023.02); *H10K 85/111* (2023.02); *H10K 85/141* (2023.02); *H10K 85/151* (2023.02); *H10K 85/341* (2023.02); *H10K 85/60* (2023.02); *C09K 2211/10* (2013.01)

(58) Field of Classification Search
None
See application file for complete search history.

(56) References Cited

U.S. PATENT DOCUMENTS 7,588,828 B2 9/2009 Mushtaq et al.
8,679,543 B2 3/2014 Bartel et al.
(Continued)

FOREIGN PATENT DOCUMENTS

JP 2007-212976 A 8/2007
JP 2013-57834 A 3/2013
(Continued)

OTHER PUBLICATIONS

Communication dated Jul. 7, 2025, issued by the Korean Intellectual Property Office in Korean Application No. 10-2023-7011052.
(Continued)

*Primary Examiner* — Anthony Ho
(74) *Attorney, Agent, or Firm* — Sughrue Mion, PLLC

(57) ABSTRACT

The present invention relates to a color conversion device (100).

20 Claims, 5 Drawing Sheets

(51) Int. Cl.

| | |
|---|---|
| ***H10K 59/12*** | (2023.01) |
| ***H10K 59/35*** | (2023.01) |
| ***H10K 59/38*** | (2023.01) |
| ***H10K 59/70*** | (2023.01) |
| ***H10K 59/80*** | (2023.01) |
| ***H10K 85/10*** | (2023.01) |
| ***H10K 85/30*** | (2023.01) |
| ***H10K 85/60*** | (2023.01) |

(56) References Cited

U.S. PATENT DOCUMENTS

| | | | |
|---|---|---|---|
| 9,529,228 | B2 | 12/2016 | Banin et al. |
| 10,509,319 | B2 | 12/2019 | Suzuki et al. |
| 10,680,186 | B2 | 6/2020 | Hatakeyama et al. |
| 10,739,678 | B2 | 8/2020 | Kitagawa |
| 11,269,255 | B2 | 3/2022 | Hirayama et al. |
| 11,703,711 | B2 | 7/2023 | Kim et al. |
| 2011/0062859 | A1 | 3/2011 | Kawamura |
| 2016/0231615 | A1 | 8/2016 | Nam et al. |
| 2020/0157419 | A1 | 5/2020 | Kishimoto et al. |
| 2020/0264461 | A1 | 8/2020 | Kuwana et al. |
| 2022/0256875 | A1 | 8/2022 | Wang et al. |

FOREIGN PATENT DOCUMENTS

| | | | |
|---|---|---|---|
| JP | 2016-45219 | A | 4/2016 |
| JP | WO2017/002833 | A1 | 1/2017 |
| JP | 2018-91924 | A | 6/2018 |
| JP | 2019-179111 | A | 10/2019 |
| JP | 2021-128226 | A | 9/2021 |
| KR | 10-2010-0114101 | A | 10/2010 |
| KR | 20160097445 | A | 8/2016 |
| KR | 20170126888 | A | 11/2017 |
| KR | 10-2019-0061744 | A | 6/2019 |
| KR | 20190106489 | A | 9/2019 |
| KR | 10-2020-0060430 | A | 5/2020 |
| WO | 2017054898 | A1 | 4/2017 |
| WO | 2019002239 | A1 | 1/2019 |

OTHER PUBLICATIONS

International Search Report PCT/EP2021/074076 dated Jan. 7, 2022 (pp. 1-3).
Communication issued Nov. 4, 2025 by the Japan Patent Office in Japanese Patent Application No. 2023-514897.
Communication issued on May 19, 2026 by the Japanese Patent Office in Japanese Patent Application No. 2023-514897.

DEVICE

FIELD OF THE INVENTION

The present invention relates to a color conversion device, an optical device containing at least one color conversion device, method for fabricating a color conversion device and use of a color conversion device.

BACKGROUND ART

WO 2017/054898 A1 describes a composition comprising red emission type nanocrystals, wetting and dispersing agent, propylene glycol monomethyl ether acetate as a solvent, an acryl polymer mixture including an acrylic unit including an acid group and a silane modified acrylic unit.

WO 2019/002239 A1 discloses a composition comprising a semiconducting light emitting nanoparticles, a polymer and a (meth)acrylate such as 1.4. cyclohexanedimethanol-monoacrylate having high viscosity around 90 cp.

PATENT LITERATURE

1. WO 2017/054898 A1
2. WO 2019/002239 A1

SUMMARY OF THE INVENTION

However, the inventors newly have found that there are still one or more of considerable problems for which improvement is desired, as listed below.

improved optical properties of bank, improved compatibility between a bank and a composition containing a light emitting moiety (e.g. QD ink), improved wetting properties and chemical stability towards a composition containing a light emitting moiety, less degradation of the bank structure upon bringing the composition containing a light emitting moiety into contact with the bank, Such degradation may be (partial or complete) dissolution of the bank structure by the QD ink formulation, delamination of the bank structure and/or intermixing of the bank and the QD ink. This would lead to a loss of integrity of the bank structure and/or a loss of the well-defined pixel structure. realizing adequate chemical resistance of the bank so that no degradation is observed upon filling the wells of the bank structure with QD Ink, realizing low curing temperature (e.g. 100° C.) properties of the bank, providing a bank having high resolution and/or excellent light shielding properties. Providing a bank composition configured to be developed even with a low-concentration alkaline developer other than an organic developer and is excellent also in environmental properties, improved homogeneous dispersion of semiconducting light emitting nanoparticles in the composition, improved homogeneous dispersion of scattering particles in the composition, preferably improved homogeneous dispersion of both semiconducting light emitting nanoparticles and scattering particles, more preferably improved homogeneous dispersion of semiconducting light emitting nanoparticles and/or scattering particles without solvent; composition having lower viscosity suitable for inkjet printing, preferably a composition which can keep lower viscosity even if it is mixed with high loading of semiconducting light emitting nanoparticles and/or scattering particles, even more preferably without solvent; composition having lower vaper pressure for large area uniform printing;

improved QY and/or EQE of semiconducting light emitting nanoparticles in the composition, improved QY and/or EQE of semiconducting light emitting nanoparticles after printing; improved thermal stability; easy printing without clogging at a printing nozzle; easy handling of the composition, improved printing properties; simple fabrication process; improved absorbance of blue light; improved solidity of a later made from the composition after inkjet printing.

The inventors aimed to solve one or more of the above-mentioned problems.

Then it is found a novel a color conversion device (100) comprising at least a $1^{st}$ pixel (161) comprising at least a matrix material (120) containing a light emitting moiety (110), and a bank (150) comprising at least a polymer material, preferably the color conversion device (100) further contains a supporting medium (170).

In another aspect, the present invention also relates to an optical device (300, 400, 500) containing at least one color conversion device (100) and a functional medium (320, 420, 520) configured to modulate a light or configured to emit light.

In another aspect, the present invention relates to a method for fabricating a color conversion device (100) comprising at least a $1^{st}$ pixel (161) comprising at least a matrix material (120) containing a light emitting moiety (110), and a bank (150) comprising at least a polymer material, containing at least the following steps, preferably in this sequence, i) Providing a $2^{nd}$ composition onto a surface of a supporting medium
ii) Curing the 2nd composition,
iii) Applying photo-patterning to the cured said composition to fabricate bank and a patterned pixel reasion,
iv) Providing a 1st composition to at least one pixel resion, preferably by ink-jetting,
v) Curing the 1st composition, preferably said color conversion device (100) further contains a supporting medium (170).

In another aspect, the present invention further relates to the color conversion device (100) obtainable or obtained from the method of the present invention.

In another aspect, the present invention also relates to use of the color conversion device (100) in an optical device (300) containing at least one functional medium (320, 420, 520) configured to modulate a light or configured to emit light.

Further advantages of the present invention will become evident from the following detailed description.

LIST OF REFERENCE SIGNS IN FIG. 1

Figure 1:
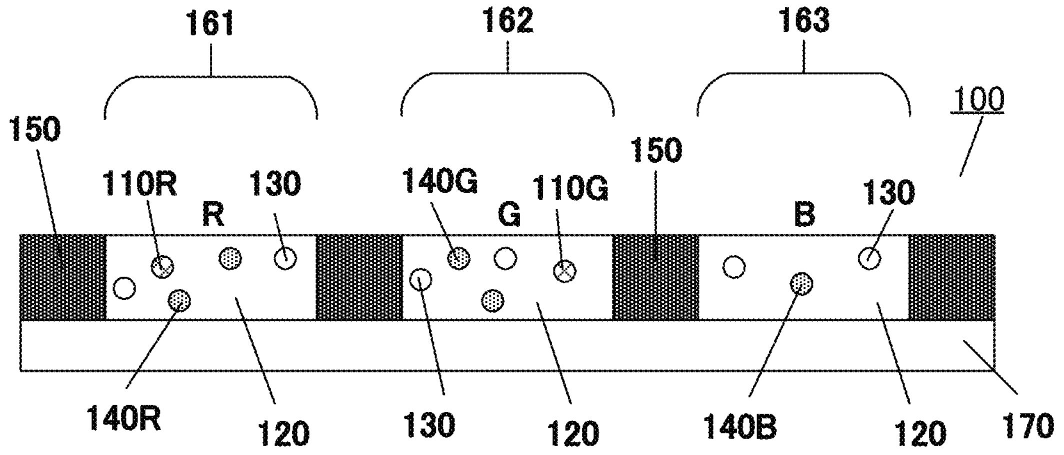
FIG. 1: shows a cross sectional view of a schematic of one embodiment of a color conversion film (100).
Figure 2:
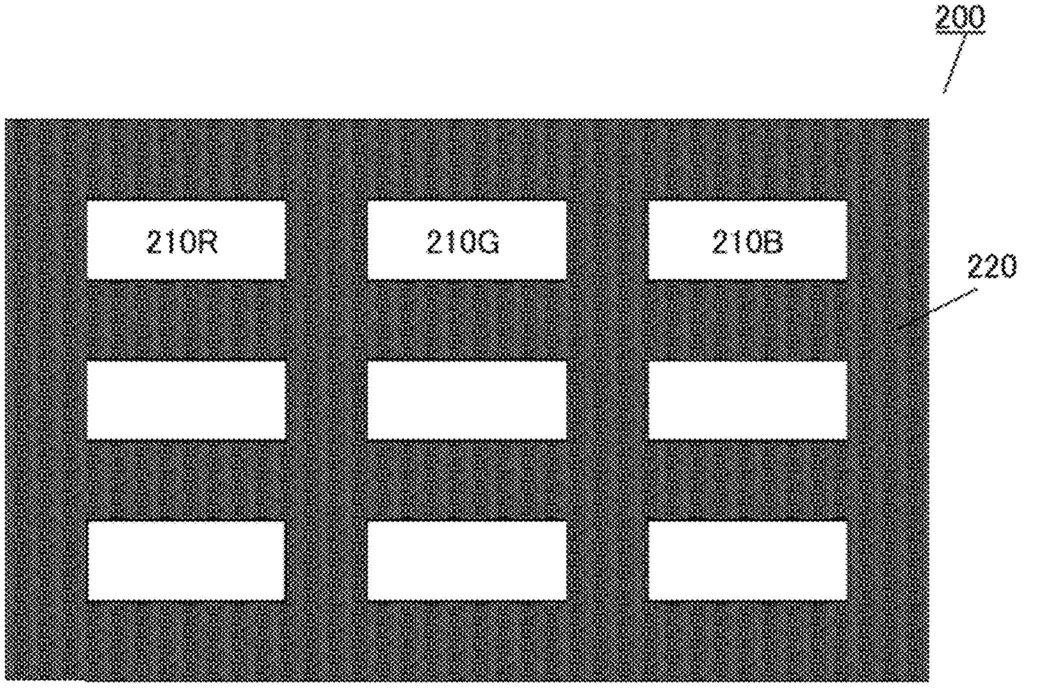
FIG. 2: shows a top view of a schematic of another embodiment of a color conversion film (100) of the invention.
Figure 3:
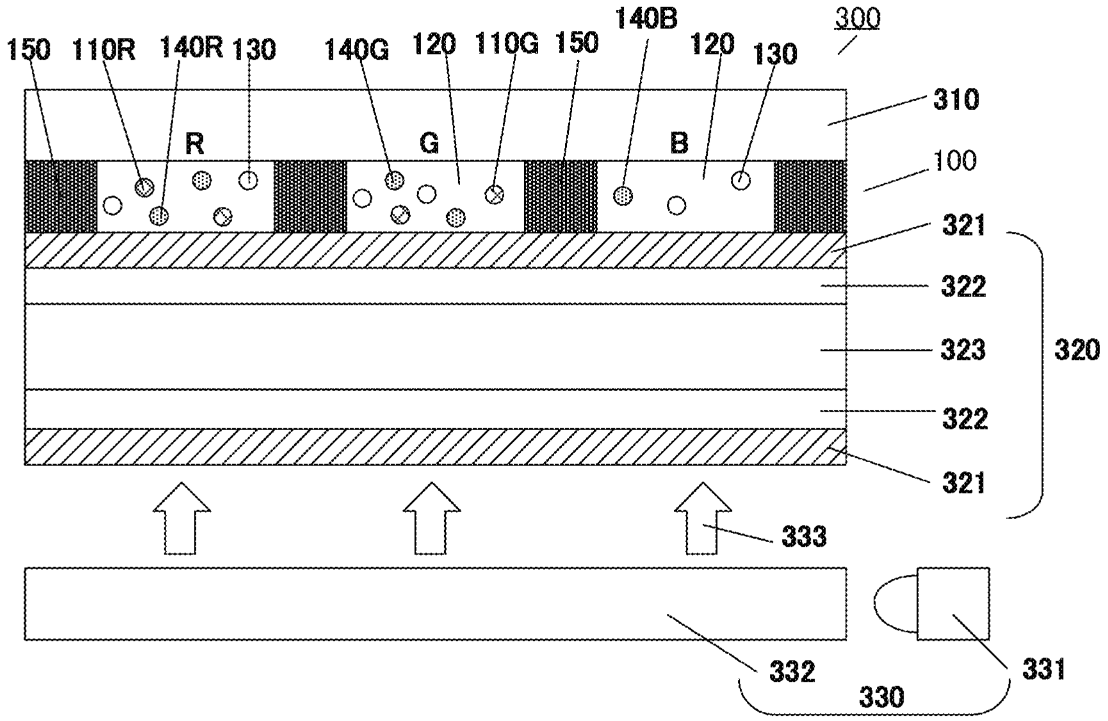
FIG. 3: shows a cross sectional view of a schematic of one embodiment of an optical device (300) of the invention.

100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
161. a 1$^{st}$ pixel
162. a 2$^{nd}$ pixel
163. a 3$^{rd}$ pixel
170. a supporting medium (a substrate) (optional)

LIST OF REFERENCE SIGNS IN FIG. 2

200. a color conversion film
210R. a pixel (red)
210G. a pixel (green)
210B. a pixel (blue)
220. a bank

LIST OF REFERENCE SIGNS IN FIG. 3

300. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
320. a light modulator
321. a polarizer
322. an electrode
323. a liquid crystal layer
330. a light source
331. a LED light source
332. a light guiding plate (optional)
333. light emission from the light source (330)

LIST OF REFERENCE SIGNS IN FIG. 4

400. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
420. a light modulator
421. a polarizer
422. an electrode
423. a liquid crystal layer
430. a light source
431. a LED light source
432. a light guiding plate (optional)
440. a color filter
433. light emission from the light source (330)

LIST OF REFERENCE SIGNS IN FIG. 5

500. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
520. a light emitting device (e.g. OLED)
521. a TFT
522. an electrode (anode)
523. a substrate
524. an electrode (cathode)
525. light emitting layer (e.g. OLED layer(s))
526. light emission from a light emitting device (520)
530. an optical layer (e.g. polarizer) (optional)
540. a color filter

DETAILED DESCRIPTION OF THE INVENTION

In the present specification, symbols, units, abbreviations, and terms have the following meanings unless otherwise specified.

In the present specification, unless otherwise specifically mentioned, the singular form includes the plural form and "one" or "that" means "at least one". In the present specification, unless otherwise specifically mentioned, an element of a concept can be expressed by a plurality of species, and when the amount (for example, mass % or mol %) is described, it means sum of the plurality of species. "And/or" includes a combination of all elements and also includes single use of the element.

In the present specification, when a numerical range is indicated using "to" or "-", it includes both endpoints and units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon.

Further, the aromatic ring means a hydrocarbon comprising a conjugated unsaturated ring structure, and the alicycle means a hydrocarbon having a ring structure but comprising no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and optionally includes a linear or branched alkyl in the cyclic structure as a side chain.

In the present specification, the aryl means a group obtained by removing any one hydrogen from an aromatic hydrocarbon. The alkylene means a group obtained by removing any two hydrogens from a linear or branched, saturated hydrocarbon. The arylene means a hydrocarbon group obtained by removing any two hydrogens from an aromatic hydrocarbon.

In the present specification, the descriptions such as "$C_{x-y}$", "$C_x$-$C_y$" and "$C_x$" mean the number of carbons in the molecule or substituent group. For example, $C_{1-6}$ alkyl means alkyl having 1 to 6 carbons (such as methyl, ethyl, propyl, butyl, pentyl and hexyl). Further, the fluoroalkyl as used in the present specification refers to one in which one or more hydrogen in alkyl is replaced with fluorine, and the fluoroaryl is one in which one or more hydrogen in aryl are replaced with fluorine.

In the present specification, when polymer has a plural types of repeating units, these repeating units copolymerize. These copolymerization are any of alternating copolymerization, random copolymerization, block copolymerization, graft copolymerization, or a mixture of any of these.

In the present specification, "%" represents mass % and "ratio" represents ratio by mass.

In the present specification, Celsius is used as the temperature unit. For example, 20 degrees means 20 degrees Celsius.

According to the present invention, in one aspect, the color conversion device (100) comprises, essentially consist of, or consist of, at least a $1^{st}$ pixel (161) comprising at least a matrix material (120) containing a light emitting moiety (110), and a bank (150) comprising at least a polymer material, preferably the color conversion device (100) further contains a supporting medium (170).

$1^{st}$ Pixel (161)

According to the present invention, said $1^{st}$ pixel (161) comprises at least a matrix material (120) containing a light emitting moiety (110). In a preferable embodiment, the $1^{st}$ pixel (161) is a solid layer obtained or obtainable by curing a $1^{st}$ composition containing at least one acrylate monomer together with at least one light emitting moiety (110), preferably said curing is a photo curing by photo irradiation, thermal curing or a combination of a photo curing and a thermal curing.

In some embodiments of the present invention, the layer thickness of the pixel (161) is in the range from 0.1 to 100 μm, preferably it is from 1 to 50 μm, more preferably from 5 to 25 μm.

In some embodiments of the present invention, the color conversion device (100) further contains a $2^{nd}$ pixel (162), preferably the device (100) contains at least said $1^{st}$ pixel (161), $2^{nd}$ pixel (162) and a $3^{rd}$ pixel (163), more preferably said $1^{st}$ pixel (161) is a red color pixel, the $2^{nd}$ pixel (162) is a green color pixel and the $3^{rd}$ pixel (163) is a blue color pixel, even more preferably the $1^{st}$ pixel (161) contains a red light emitting moiety (110R), the 2nd color pixel (162) contains a green light emitting moiety (110G) and the $3^{rd}$ pixel (163) does not contain any light emitting moiety.

In some embodiments, at least one pixel (160) additionally comprises at least one light scattering particle (130) in the matrix material (120), preferably the pixel (160) contains a plurality of light scattering particles (130).

In some embodiments of the present invention, said $1^{st}$ pixel (161) consists of one pixel or two or more sub-pixels configured to emit red-color when irradiated by an excitation light, more preferably said sub-pixels contains the same light emitting moiety (110).

Matrix Material (120)

In a preferable embodiment, the matrix material (120) contains a (meth)acrylate polymer, preferably it is a methacrylate polymer, an acrylate polymer or a combination of thereof, more preferably it is an acrylate polymer, even more preferably said matrix material (120) is obtained or obtainable from a $1^{st}$ composition containing at least one acrylate monomer, further more preferably said matrix material (120) is obtained or obtainable from a $1^{st}$ composition containing at least one di-acrylate monomer, particularly preferably said matrix material (120) is obtained or obtainable from a $1^{st}$ composition containing at least one di-acrylate monomer and a mono-acrylate monomer, preferably said composition is a photosensitive composition.

Light Emitting Moiety (110)

In a preferable embodiment of the present invention, said light emitting moiety (110) is an organic and/or inorganic light emitting material, preferably it is an organic dye, inorganic phosphor and/or a semiconducting light emitting nanoparticle such as a quantum material.

In some embodiments of the present invention, the total amount of the light emitting moiety (110) is in the range from 0.1 wt. % to 90 wt. % based on the total amount of the $1^{st}$ pixel (161), preferably from 10 wt. % to 70 wt. %, more preferably from 30 wt. % to 50 wt. %.

iii) Semiconducting Light Emitting Nanoparticle

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nanosized" means the size in between 0.1 nm to 150 nm, more preferably 3 nm to 50 nm.

Thus, according to the present invention, "semiconducting light emitting nanoparticle" is taken to mean that the light emitting material which size is in between 0.1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 150 nm, preferably 0.5 nm to 150 nm, more preferably 1 nm to 50 nm.

According to the present invention, the term "size" means the average diameter of the longest axis of the semiconducting nanosized light emitting particles.

The average diameter of the semiconducting nanosized light emitting particles is calculated based on 100 semiconducting light emitting nanoparticles in a TEM image created by a Tecnai G2 Spirit Twin T-12 Transmission Electron Microscope.

In a preferred embodiment of the present invention, the semiconducting light emitting nanoparticle of the present invention is a quantum sized material.

According to the present invention, the term "quantum sized" means the size of the semiconducting material itself without ligands or another surface modification, which can show the quantum confinement effect, like described in, for example, ISBN: 978-3-662-44822-9.

For example, CdS, CdSe, CdTe, ZnS, ZnSe, ZnSeS, ZnTe, ZnO, GaAs, GaP, GaSb, HgS, HgSe, HgSe, HgTe, InAs, InP, InPZn, InPZnS, InPZnSe, InPZnSeS, InPZnGa, InPGaS, InPGaSe, InPGaSeS, InPZnGaSeS and InPGa, InCdP, InPCdS, InPCdSe, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$, $TiO_2$ alloys and a combination of any of these can be used.

In a preferred embodiment of the present invention, the 1$^{st}$ semiconducting material comprises at least one element of the group 13 of the periodic table, and one element of the group 15 of the periodic table, preferably the element of the group 13 is In, and the element of the group 15 is P, more preferably the 1$^{st}$ semiconducting material is selected from the group consisting of InP, InPZn, InPZnS, InPZnSe, InPZnSeS, InPZnGa, InPGaS, InPGaSe, InPGaSeS, InPZnGaSeS and InPGa.

According to the present invention, a type of shape of the core of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped core and—or a semiconducting light emitting nanoparticle can be synthesized.

In some embodiments of the present invention, the average diameter of the core is in the range from 1.5 nm to 3.5 nm.

The average diameter of the core is calculated based on 100 semiconducting light emitting nanoparticles in a TEM image created by a Tecnai G2 Spirit Twin T-12 Transmission Electron Microscope.

In some embodiments of the present invention, at least one the shell layer comprises or a consisting of a 1$^{st}$ element of group 12 of the periodic table and a 2$^{nd}$ element of group 16 of the periodic table, preferably, the 1$^{st}$ element is Zn, and the 2$^{nd}$ element is S, Se, or Te; preferably a first shell layer covering directly onto said core comprises or a consisting of a 1$^{st}$ element of group 12 of the periodic table and a 2$^{nd}$ element of group 16 of the periodic table, preferably, the 1$^{st}$ element is Zn, and the 2$^{nd}$ element is S, Se, or Te.

In a preferred embodiment of the present invention, at least one shell layer (a first shell layer) is represented by following formula (XI), preferably the shell layer directly covering the core is represented by the chemical formula (XI);

$$ZnS_xSe_yTe_z \quad \text{(XI)}$$

wherein 0≤x≤1, 0≤y≤1, 0≤z≤1, and x+y+z=1, preferably 0≤x≤1, 0≤y≤1, z=0, and x+y=1, preferably, the shell layer is ZnSe, $ZnS_xSe_y$, $ZnSe_yTe_z$ or $ZnS_xTe_z$.

In some embodiments of the present invention, said shell layer is an alloyed shell layer or a graded shell layer, preferably said graded shell layer is $ZnS_xSe_y$, $ZnSe_yTe_z$, or $ZnS_xTe_z$, more preferably it is $ZnS_xSe_y$.

In some embodiments of the present invention, the semiconducting light emitting nanoparticle further comprises 2$^{nd}$ shell layer onto said shell layer, preferably the 2$^{nd}$ shell layer comprises or a consisting of a 3$^{rd}$ element of group 12 of the periodic table and a 4$^{th}$ element of group 16 of the periodic table, more preferably the 3$^{rd}$ element is Zn, and the 4$^{th}$ element is S, Se, or Te with the proviso that the 4$^{th}$ element and the 2$^{nd}$ element are not same.

In a preferred embodiment of the present invention, the 2$^{nd}$ shell layer is represented by following formula (XI"), $$ZnS_xSe_yTe_z \quad \text{(XI')}$$

wherein 0≤x≤1, 0≤y≤1, 0≤z≤1, and x+y+z=1, preferably, the shell layer is ZnSe, $ZnS_xSe_y$, $ZnSe_yTe_z$, or $ZnS_xTe_z$ with the proviso that the shell layer and the 2$^{nd}$ shell layer is not the same.

In some embodiments of the present invention, said 2$^{nd}$ shell layer can be an alloyed shell layer.

In some embodiments of the present invention, the semiconducting light emitting nanoparticle can further comprise one or more additional shell layers onto the 2$^{nd}$ shell layer as a multishell.

According to the present invention, the term "multishell" stands for the stacked shell layers consisting of three or more shell layers.

For example, CdSe/CdS, CdSeS/CdZnS, CdSeS/CdS/ZnS, ZnSe/CdS, CdSe/ZnS, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS, InZnPS/ZnS, InZnPS ZnSe, InZnPS/ZnSe/ZnS, ZnSe/CdS, ZnSe/ZnS or combination of any of these, can be used. Preferably, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS.

Such semiconducting light emitting nanoparticles are publicly available (for example from Sigma Aldrich) and/or can be synthesized with the method described for example in U.S. Pat. Nos. 7,588,828 B, 8,679,543 B and Chem. Mater. 2015, 27, pp 4893-4898.

In some embodiments of the present invention, the composition comprises two or more semiconducting light emitting nanoparticles.

In some embodiments of the present invention, the composition comprises a plurality of semiconducting light emitting nanoparticles.

In some embodiments of the present invention, the total amount of the semiconducting light emitting nanoparticles is in the range from 0.1 wt. % to 90 wt. % based on the total amount of the composition, preferably from 10 wt. % to 70 wt. %, more preferably from 30 wt. % to 50 wt. %.

Bank (150)

In some embodiments of the present invention, the height of the bank (150) is in the range from 0.1 to 100 μm, preferably it is from 1 to 50 μm, more preferably from 1 to 25 μm, furthermore preferably from 5 to 20 μm.

In a preferred embodiment of the present invention, the bank (150) is configured to determine the area of said 1$^{st}$ pixel (161) and at least a part of the bank (150) is directly contacting to at least a part of the 1$^{st}$ pixel (161), preferably said 2$^{nd}$ polymer of the bank (150) is directly contacting to at least a part of the 1$^{st}$ polymer of the 1$^{st}$ pixel (161).

More preferably, said bank (150) is photolithographically patterned and said 1$^{st}$ pixel (161) is surrounded by the bank (150), preferably said 1$^{st}$ pixel (161), the 2$^{nd}$ pixel (162) and the 3$^{rd}$ pixel (163) are all surrounded by the photolithographically patterned bank (150).

Polymer Material of the Bank

In a preferred embodiment of the present invention, said polymer material of the bank is a thermosetting resin, preferably it is a photosensitive resin, more preferably it is a thermosetting and photosensitive resin containing an alkaline soluble polymer, preferably the weight-average molecular weight of said alkaline soluble polymer is in the range from 1,000 to 100,000, more preferably it is from 1,200 to 80,000, preferably the solid-acid value of the alkaline soluble polymer is in the range from 10 to 500 mg KOH/g, more preferably it is from 20 to 300 mg KOH/g, preferably said alkaline soluble polymer is selected from (meth)acrylate polymer, siloxane (meth)acrylate polymer, more preferably it is a methacrylate polymer, an acrylate polymer or a combination of thereof, even more preferably the polymer material is an acrylate polymer, further more preferably said bank (150) is obtained or obtainable from a $2^{nd}$ composition containing at least one alkaline soluble polymer and a chemical compound containing at least two (meth)acryloyloxy groups, particularly preferably said bank (150) is obtained or obtainable from a $2^{nd}$ composition containing at least one alkaline soluble polymer and a chemical compound containing at least two (meth)acryloyloxy groups and a surfactant, preferably said composition is a photosensitive composition, preferably said bank is a cured layer obtained or obtainable from the composition, more preferably said bank is a photolithographically patterned cured layer obtained or obtainable from the composition. As to such materials, publicly available one can be used.

Surfactant of the Bank

According to the present invention, preferably said bank (150) further contains a surfactant, preferably at least a part of the surface of the bank is covered by said surfactant, more preferably the surface of the bank is hydrophobic, even more preferably the surface of the top part of the bank is oil-repellent, preferably the total amount of the surfactant is in the range from 0.001 to 5 wt. %, more preferably from 0.01 to 4 wt. %, even more preferably from 0.05 to 3 wt. %, furthermore preferably from 0.1 to 1 wt. % based on the total amount of the bank.

In a further preferable embodiment, the bank (150) contains a nonionic surfactant, preferably said nonionic surfactant is a hydrocarbon based nonionic surfactant, fluorine-based nonionic surfactant, organosilicon based nonionic surfactant or a combination of these, more preferably said hydrocarbon based nonionic surfactant is selected from one or more members the group consisting of polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol such as 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-di-methyl-3-hexyne-2,5-diol, 2,5-di-methyl-2,5-hexanediol; polyethoxylate of acetylene alcohol; acetylene glycol derivatives, such as polyethoxylate of acetylene glycol; preferably fluorine-based nonionic surfactant is selected from one or more of fluorine-containing surfactants; preferably said hydrocarbon based nonionic surfactant is selected from organosiloxane surfactants, preferably the surfactant is a fluorine-based nonionic surfactant. As to such surfactants, publicly available surfactants can be used.

Saccharide in the Bank

In a preferred embodiment of the present invention, the bank (150) further contains a saccharide, preferably said saccharide is selected from a monosaccharide, an oligosaccharide, a polysaccharide or a mixture of thereof, more preferably it is an oligosaccharide, even more preferably said saccharide is an oligosaccharide formed by dehydrating and condensing 2 to 10 molecules of a monosaccharide, and also includes a cyclic oligosaccharide (for example, cyclodextrin), furthermore preferably it is cyclodextrin or disaccharide obtained by condensing two molecules of monosaccharide, even more preferably it is a disaccharide obtained by condensing two molecules of monosaccharide, furthermore preferably the saccharide is oligosaccharide having an alkylene oxide having 1 to 6 carbon atoms, more preferably it has an alkylene oxide having 2 to 5 carbon atoms, and further preferably it has an ethylene oxide or propylene oxide, particularly preferably it is sucrose-alkyleneoxide-lauric acid ester, preferably the total amount of the surfactant is in the range from 0.001 to 1 wt. %, more preferably from 0.1 to 60 wt. %, even more preferably from 1 to 40 wt. %, furthermore preferably from 10 to 30 wt. % based on the total solid contents of the polymer material. For examples, sucrose ethylene oxide adduct can be used preferably. As to such surfactants, publicly available one can be used.

Colorant in the Bank

In a preferable embodiment of the present invention, the bank (150) further comprises a colorant, preferably said colorant is an organic colorant and/or an inorganic colorant, more preferably it is a black colorant selected from an organic black pigment and/or inorganic black pigment, preferably said black colorant has a light transmittance ratio represented by [light transmittance at the wavelength of 365 nm]/[light transmittance at the wavelength of 500 nm] of 1.2 or more, more preferably the ratio is 2.0 or more, preferably said black colorant has a light transmittance ratio represented by [light transmittance at the wavelength of 365 nm]/[light transmittance at the wavelength of 500 nm] of 5.0 or less, even more preferably it is in the range from 1.2 to 5.0, further more preferably it is from 2.0 to 4.0 provided that the transmittance is obtained by measuring a film obtained by the following steps: applying a composition in which 10 mass % of a black colorant is dispersed based on the total amount of the resin forming a film having a film thickness of 10 μm by applying said composition to a glass substrate, and curing at 100° C., then the obtained film is measured using UV-vis-NIR (Hitachi High-Technologies Corporation), preferably said inorganic black pigment is zirconium nitride, preferably said organic black pigment is a mixture of two or more organic color pigments, more preferably it is a mixture of red, green blue organic color pigments configured to show black color by mixing, further more preferably said organic black pigment is a mixture selected from the group consisting of an azo type, a phthalocyanine type, a quinacridone type, a benzimidazolone type, an isoindolinone type, a dioxazine type, an indanthrene type and a perylene type organic pigments, particularly preferably said organic black pigment is a mixture of one selected from the group consisting of C. I. Pigment Orange 43, C. I. Pigment Orange 64 and C. I. Pigment Orange 72, with C. I. Pigment Blue 60, C. I. Pigment Green 7, C. I. Pigment Green 36 and C. I. Pigment Green 58.

Preferably, the total amount of said colorant is 3 to 80 wt. %, preferably 5 to 50 wt. % based on the total amount of the polymer material of the bank.

Supporting Medium (170)

In some embodiments of the present invention, said supporting medium (170) is a substrate, more preferably it is a transparent substrate.

In general, said substrate such as a transparent substrate can be flexible, semi-rigid or rigid.

Publicly known transparent substrate suitable for optical devices can be used as desired.

Preferably, as a transparent substrate, a transparent polymer substrate, glass substrate, thin glass substrate stacked on a transparent polymer film, transparent metal oxides (for example, oxide silicone, oxide aluminum, oxide titanium), polymer film substrate with transparent metal oxides, can be used. Even more preferably it is a transparent polymer substrate or a glass substrate.

A transparent polymer substrate can be made from polyethylene, ethylene-vinyl acetate copolymer, ethylene-vinyl alcohol copolymer, polypropylene, polystyrene, polymethyl methacrylate, polyvinylchloride, polyvinyl alcohol, polyvinylvutyral, nylon, polyether ether ketone, polysulfone, polyether sulfone, tetrafluoroethylene-erfluoroalkylvinyl ether copolymer, polyvinyl fluoride, tetraflyoroethylene ethylene copolymer, tetrafluoroethylene hexafluoro polymer copolymer, or a combination of any of these.

The term "transparent" means at least around 60% of incident light transmittal at the thickness used in a photovoltaic device and at a wavelength or a range of wavelength used during operation of photovoltaic cells. Preferably, it is over 70%, more preferably, over 75%, the most preferably, it is over 80%.

The $1^{st}$ Composition

According to the present invention, in some embodiments, the $1^{st}$ pixel (161) is obtained or obtainable from the $1^{st}$ composition, or is a cured layer of said $1^{st}$ composition, comprises;

i) at least one (meth)acrylate monomer represented by following chemical formula (I), and ii) another material;

(I)

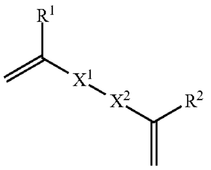

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

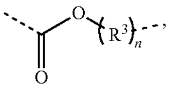

wherein n is 0 or 1;

preferably the symbol $X^2$ is

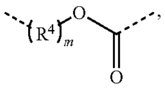

wherein m is 0 or 1;

preferably at least m or n is 1;

$R^3$ is a straight alkylene chain or alkoxylene chain having 1 to 25 carbon atoms, a cycloalkane having 3 to 25 carbon atoms or an alkyl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an alkyl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

In a preferred embodiment of the present invention, the viscosity of the composition is 35 cP or less at room temperature, preferably in the range from 1 to 35 cP, more preferably from 2 to 30 cP, even more preferably from 2 to 25 cP.

According to the present invention, said viscosity can be measured by vibration type viscometer VM-10A (SEKONIC) at room temperature. https://www.sekonic.co.jp/english/product/viscometer/vm/vm_series.html (Meth)Acrylate Monomer Represented by Chemical Formula (I) as a Matrix Material It is believed that the lower viscosity is important to make a low viscosity composition suitable for inkjet printing. Therefore, a (meth)acrylate monomer having the viscosity value within the above-mentioned parameter ranges are especially suitable to make a composition for inkjet printing. By using these (meth)acrylate monomer in a composition, when it is mixed with another material such as semiconducting light emitting nanoparticles with high loading, the composition can still keep lower viscosity within the range suitable for inkjet printing.

In a preferred embodiment of the present invention, the boiling point (B.P.) of said (meth)acrylate monomer of chemical formula (I) is 250° C. or more, preferably it is in the range from 250° C. to 350° C., even more preferably from 280° C. to 350° C., further more preferably from 300° C. to 348° C. for large area uniform inkjet printing.

It is believed that said high boiling point is also important to make a composition having a lower vapor pressure preferably less than 0.001 mmHg for large area uniform printing, it is preferable to use a (meth)acrylate monomer of formula (I) having the viscosity value of 25 cP or less at 25° C. and the boiling point at least 250° C. or more, preferably it is in the range from 250° C. to 350° C., more preferably from 300° C. to 348° C. to make a composition suitable for large area uniform inkjet printing even if it is mixed with high loading of another materials such as high loading of semiconducting light emitting nanoparticles.

According to the present invention, said B.P can be estimate by the known method such as like described in Science of Petroleum, Vol. II. p. 1281 (1398), https://www.sigmaaldrich.com/chemistry/solvents/learning-center/nomograph.html.

According to the present invention, any types of publicly available acrylates and/or methacrylates represented by chemical formula (I) can be used preferably.

Especially for the first aspect, any types of publicly available acrylates and/or methacrylates having the viscosity value of 25 cP or less at 25° C. represented by chemical formula (I) can be used.

Furthermore preferably, said $R^3$ of formula (I) and $R^4$ of formula (I) are, each independently of each other, selected from the following groups, wherein the groups can be substituted with $R^a$, preferably they are unsubstituted by $R^a$.

$*—(CH_2)_1—*$ $*—(CH_2)_2—*$ $*—(CH_2)_3—*$ $*—(CH_2)_4—*$ $*—(CH_2)_5—*$ $*—(CH_2)_6—*$ $*—(CH_2)_7—*$

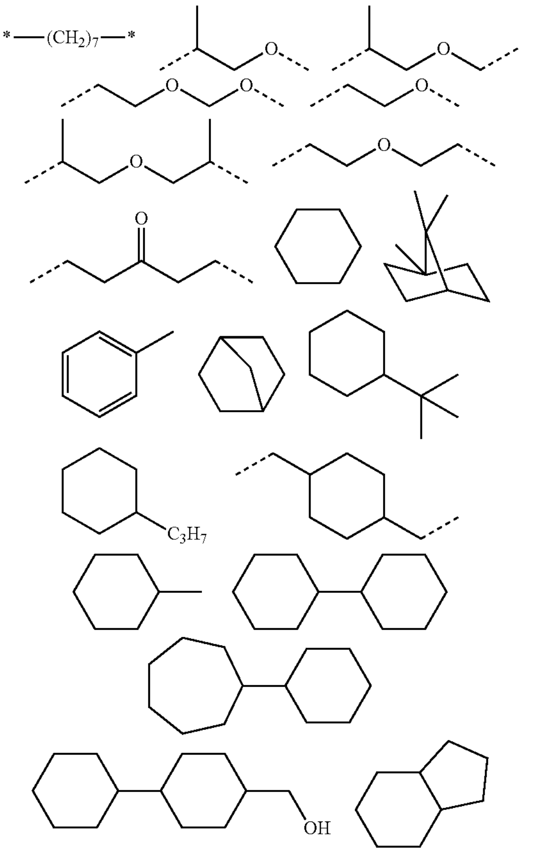

-continued

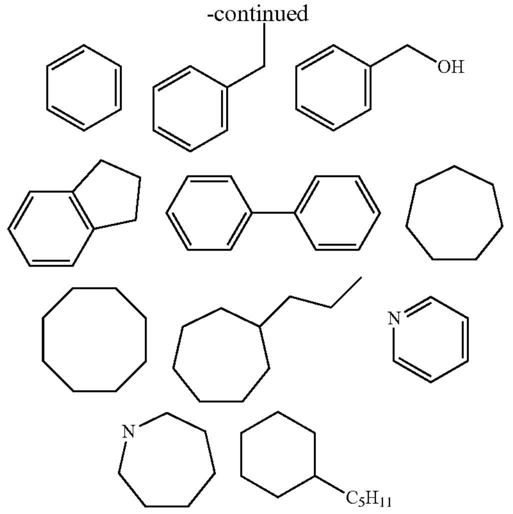

Particularly preferably, said $R^3$ and $R^4$ of formula (I) are, at each occurrence, independently or differently, selected from the following groups.

$*—(CH_2)_1—*$ $*—(CH_2)_2—*$ $*—(CH_2)_3—*$ $*—(CH_2)_4—*$ $*—(CH_2)_5—*$ $*—(CH_2)_6—*$ $*—(CH_2)_7—*$

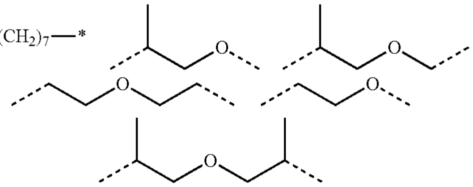

wherein "*" represents the connecting point to oxygen atom of the formula or the connecting point to $X^2$ of the formula in case of $R^3$, and wherein "*" represents the connecting point to oxygen atom of the formula or the connecting point to $X^1$ of the formula in case of $R^4$.

Furthermore preferably, said formula (I) is NDDA (BP: 342° C.), HDDMA (BP: 307) or DPGDA (BP: 314° C.).

(NDDA)

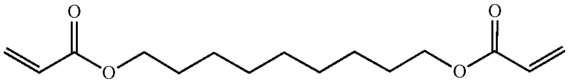

(HDDMA)

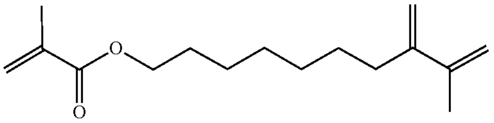

(DPGDA)

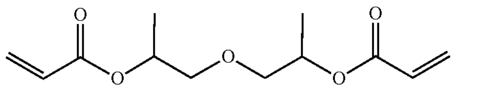

In some embodiments of the present invention, the composition further comprises another (meth)acrylate monomer represented by following chemical formula (II);

(II)

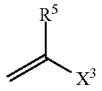

$X^3$ is a non-substituted or substituted alkyl group, aryl group or an alkoxy group;

preferably the symbol $X^3$ is

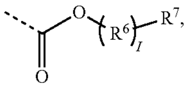

wherein l is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

(Meth)Acrylate Monomer Represented by Chemical Formula (II)

It is believed that the (meth)acrylate monomer represented by following chemical formula (II) shows much lower viscosity value than the viscosity of the (meth)acrylate monomer of formula (I). Thus, by using the (meth)acrylate monomer represented by chemical formula (II) in combination of the (meth)acrylate monomer of chemical formula (I), a composition having much lower viscosity desirable for smooth inkjet printing can be realized, preferably without decreasing External Quantum Efficiency (EQE) value.

It is believed that said combination can realize a low viscosity composition comprising high amount of another materials, such as high loading of semiconducting light emitting nanoparticles. Thus, it is especially suitable for an inkjet printing when the composition comprises another material.

In a preferable embodiment of the present invention, the boiling point (B.P.) of said (meth)acrylate monomer of chemical formula (II) is 250° C. or more, preferably the (meth)acrylate monomer of chemical formula (II) is 250° C. or more, more preferably it is in the range from 250° C. to 350° C., even more preferably from 280° C. to 350° C., further more preferably from 300° C. to 348° C. for large area uniform inkjet printing.

In a further preferable embodiment of the present invention, the boiling point (B.P.) of said (meth)acrylate monomer of chemical formula (I) and/or the boiling point (B.P.) of said (meth)acrylate monomer of chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., further more preferably from 300° C. to 348° C. for large area uniform inkjet printing.

Furthermore preferably, said $R^7$ of formula (II) is, at each occurrence, independently or differently, selected from the following groups, wherein the groups can be substituted with $R^a$, preferably they are unsubstituted by $R^a$.

| | | |
|---|---|---|
| $*{-}(CH_2)_6{-}CH_3$ | $*{-}(CH_2)_7{-}CH_3$ | $*{-}(CH_2)_8{-}CH_3$ |
| $*{-}(CH_2)_9{-}CH_3$ | $*{-}(CH_2)_{10}{-}CH_3$ | $*{-}(CH_2)_{11}{-}CH_3$ |
| $*{-}(CH_2)_{12}{-}CH_3$ | $*{-}(CH_2)_4{-}OH$ | $*{-}(CH_2)_2{-}OH$ |
| $*{-}(CH_2)_6{-}OH$ | $*{-}(CH_2)_3{-}OH$ | $*{-}(CH_2)_5{-}OH$ |

wherein "*" represents the connecting point to $R^6$ of $X^3$ in case l is 1, and it is representing the connecting point to oxygen atom of $X^3$ of the formula (II) in case n is 0.

The furthermore preferably, said formula (II) is Lauryl methacrylate (LM, viscosity 6 cP, BP: 142° C.) or Lauryl acrylate (LA, viscosity: 4.0 cP, BP: 313.2° C.).

In a preferred embodiment of the present invention, the (meth)acrylate monomer of chemical formula (II) is in the composition and the mixing ratio of the (meth)acrylate monomer of chemical formula (I) to the (meth)acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 35:65, preferably at least a purified (meth)acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

It is believed that the higher amount of the (meth)acrylate monomer of chemical formula (II) to the total amount of the (meth)acrylate monomer of chemical formula (I) leads improved EQE of the composition, and the mixing weight ratio of the (meth)acrylate monomer of chemical formula (II) to the total amount of the (meth)acrylate monomer of chemical formula (I) less than 50 wt. % is preferable from the view point of viscosity of the composition, better ink-jetting properties of the composition.

Preferably, (meth)acrylate monomers purified by using silica column are used.

It is believed that an impurity removal from the (meth) acrylate monomers by the silica column purification leads improved QY of the semiconducting light emitting nanoparticle in the composition.

In some embodiments of the present invention, the composition further comprises a (meth)acrylate monomer represented by following chemical formula (III);

(III)

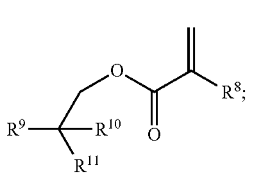

wherein $R^9$ is hydrogen atom, a straight alkyl group having 1 to 25 carbon atoms or a (meth)acryl group represented by chemical formula (IV)

(IV)

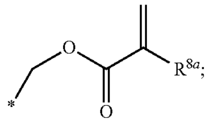

$R^6$ is hydrogen atom, a straight alkyl group having 1 to 25 carbon atoms or a (meth)acryl group represented by chemical formula (V)

(V)

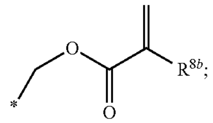

$R^7$ is hydrogen atom, a straight alkyl group having 1 to 25 carbon atoms or a (meth)acryl group represented by chemical formula (VI)

(VI)

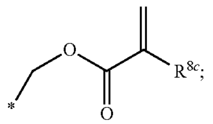

wherein $R^{8a}$, $R^{8b}$ and $R^{8c}$ are, each independently or dependently of each other at each occurrence, H or $CH_3$;

wherein at least one of $R^9$, $R^{10}$ and $R^{11}$ is a (meth)acryl group, preferably two of $R^9$, $R^{10}$ and $R^{11}$ are a (meth) acryl group and other one is a hydrogen atom or a straight alkyl group having 1 to 25 carbon atoms, preferably the electric conductivity (S/cm) of the (meth)acrylate monomer of formula (III) is $1.0*10^{-10}$ or less, preferably it is $5.0*10^{-11}$ or less, more preferably it is in the range from $5.0*10^{-11}$ to $1.0*10^{-15}$, even more preferably it is in the range from $5.0*10^{-12}$ to $1.0*10^{-15}$.

It is believed that the (meth)acrylate monomer of chemical formula (III) is useful to improve its solidity of a later made from the composition after inkjet printing.

According to the present invention, a publicly known a (meth)acrylate monomer represented by following chemical formula (III) can be used to improve solidity of a layer after inkjet printing and cross linking.

Very preferably, Trimethylolpropane Triacrylate (TMPTA) is used as the (meth)acrylate monomer of chemical formula (III).

In a preferable embodiment of the present invention, the amount of the (meth)acrylate monomer of chemical formula (III) based on the total amount of (meth)acrylate monomers in the composition is in the range from 0.001 wt. % to 25 wt. %, more preferably in the range from 0.1 wt. % to 15 wt. %, even more preferably from 1 wt. % to 10 wt. %, further more preferably from 3 to 7 wt %.

Preferably, there (meth)acrylate monomers are purified by using silica column, are used.

It is believed that an impurity removal from the (meth) acrylate monomers by the silica column purification leads improved QY of the semiconducting light emitting nanoparticle in the composition.

According to the present invention, in a preferred embodiment, the viscosity of the composition is 35 cP or less at room temperature, preferably in the range from 1 to 35 cP, more preferably from 2 to 30 cP, even more preferably from 2 to 25 cP.

In a preferred embodiment of the present invention, the composition comprises a solvent 10 wt % or less based on the total amount of the composition, more preferably it is 5 wt % or less, more preferably it is a solvent free composition, preferably the composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol monoalkyl ethers, propylene glycol, and propylene glycol monoalkyl ethers.

It is believed that the less than 10 wt % of solvent in the composition leads improved ink-jetting and it can avoid 2nd or more ink-jetting onto the same pixel after evaporation of the solvent.

According to the present invention, preferably the composition further comprises an another material selected from one or more members of the group consisting of;

iii) at least one semiconducting light emitting nanoparticle comprising a 1st semiconducting nanoparticle, optionally one or more shell layers covering at least a part of the 1st semiconducting nanoparticle, preferably said nanoparticle comprises a ligand, more preferably said nanoparticle comprises a alkyl type ligand having carbon atoms 2 to 25, preferably from 6 to 15 (such as C12, C8);

iv) another (meth)acrylate monomer;

v) scattering particles, and vi) optically transparent polymers, anti-oxidants, radical quenchers, photo initiators and/or surfactants.

In some embodiments of the present invention, preferably the composition of the present invention comprises v) scattering particles; and vii) at least one polymer configured so that said polymer enables to the scattering particles to disperse in the composition;

wherein the polymer comprises at least a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the polymer comprises a tertiary amine, phosphine oxide group, phosphonic acid, or a phosphate group.

According to the present invention, the polymer configured so that said polymer enables to the scattering particles to disperse in the composition comprises at least a repeating unit A comprising a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the repeating unit A comprises a tertiary amine, phosphine oxide group, phosphonic acid, or a phosphate group.

In some embodiments of the present invention, the repeating unit A and the repeating unit B are a constitutional repeating unit.

Even more preferably, the repeating unit A comprises a tertiary amine represented by following chemical formula (VII), $$—NR^{12}R^{13}R^{14} \quad \text{(VII)}$$

wherein $R^{12}$ is a straight or a branched alkyl group having 1 to 30 carbon atoms, or an aryl group having 1 to 30 carbon atoms; $R^{13}$ is a hydrogen atom, a straight or a branched alkyl group having 1 to 30 carbon atoms, or an aryl group having 1 to 30 carbon atoms; $R^{12}$ and $R^{13}$ can be same or different of each other; $R^{14}$ is a single bond, a straight or a branched alkylene group having 1 to 30 carbon atoms, alkenylene group having 1 to 30 carbon atoms, (poly)oxaalkylene group having 1 to 30 carbon atoms.

Even more preferably, $R^{12}$ is a straight or a branched alkyl group having 1 to 30 carbon atoms; $R^{13}$ is a straight or a branched alkyl group having 1 to carbon atoms; $R^{12}$ and $R^{13}$ can be same or different of each other.

Furthermore preferably, $R^{12}$ is methyl group, ethyl group, n-propyl group, or n-butyl group; $R^{13}$ is methyl group, ethyl group, n-propyl group, or n-butyl group.

According to the present invention, in a preferred embodiment, the repeating unit A does not contain a salt.

In a preferred embodiment of the present invention, the polymer is a copolymer selected from the group consisting of graft copolymers, block copolymers, alternating copolymers, and random copolymers, preferably said copolymer comprises the repeating unit A, and repeating unit B that does not include any phosphine group, phosphine oxide group, phosphate group, phosphonate group, thiol group, tertiary amine, carboxyl group, hetero cyclic group, silane group, sulfonic acid, hydroxyl group, phosphonic acid, and a combination of thereof, more preferably the copolymer is a block copolymer represented by following chemical formula (VIII) or (IX), $$A_n—B_m \quad \text{(VIII)}$$

$$B_o—A_n—B_m \quad \text{(IX)}$$

wherein the symbol "A" represents a repeating unit A; the symbol "B" is taken to mean the repeating unit B; the symbols "n", "m", and "o" are at each occurrence, independently or dependently of each other, integers 1 to 100, preferably 5 to 75, more preferably 7 to 50; even more preferably the repeating unit B comprises a polymer chain selected from the group consisting of (poly)ethylene, (poly) phenylene, polydivinylbenzene, (poly)ethers, (poly)esters, (poly)amides, (poly)urethanes, (poly)carbonates, polylactic acids, (poly)vinyl esters, (poly)vinyl ethers, polyvinyl alcohols, polyvinylpyrrolidones, celluloses and derivatives of any of these.

In a preferred embodiment of the present invention, the polymer chain of the repeating unit B is a polyethylene glycol.

More preferably, the repeating unit B comprises a chemical structure represented by following chemical formula (X), Chemical formula (X)

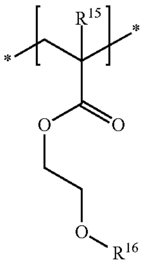

wherein the chemical formula (X), $R^{15}$ is hydrogen atom, or methyl group; $R^{16}$ is alkyl group having 1 to 10 carbon atoms; and n is an integer 1 to 5, "*" represents the connecting point to an another polymer repeating unit or a terminal of the polymer.

Even more preferably, $R^{15}$ can be a hydrogen atom, or methyl group, $R^{16}$ can be an ethyl group, and n is an integer 1 to 5.

In some embodiments of the present invention, the surface of the core, or the outermost surface of one or more shell layers of the semiconducting light emitting nanoparticle can be partly or fully over coated by the polymer.

By using ligand exchange method, described in for example, Thomas Nann, Chem. Commun., 2005, 1735-1736, DOI: 10.1039/b-414807j, the polymer can be introduced onto the surface of the core or the outermost surface of the core of the semiconducting light emitting nanoparticle.

According to the present invention, in some embodiments, the content of said polymer is in the range from 1% to 500% by weight, more preferably in the range from 20% to 350% by weight, even more preferably from 50% to 200% by weight with respect to the total weight of the semiconducting light emitting nanoparticle.

In a preferred embodiment of the present invention, the weight average molecular weight (Mw) of the polymer is in the range from 200 g/mol to 30,000 g/mol, preferably from 250 g/mol to 2,000 g/mol, more preferably from 400 g/mol to 1,000 g/mol.

The molecular weight Mw is determined by means of GPC (=gel permeation chromatography) against an internal polystyrene standard.

As the polymer, commercially available wetting and dispersing additives which can be solved in non-polar and/or low polar organic solvent can be used preferably. Such as BYK-111, BYK-LPN6919, BYK-103, BYK-P104, BYK-163 ([trademark], from BYK com.), TERPLUS MD1000 series, such as MD1000, MD1100 ([trademark], from Otsuka Chemical), Poly(ethylene glycol) methyl ether amine (Sigma-Ald 767565 [trademark], from Sigma Aldrich), Polyester bis-MPA dendron, 32 hydroxyl, 1 thiol, (Sigma-Ald 767115 [trademark], from Sigma Aldrich), LIPONOL DA-T/25 (From Lion Specialty Chemicals Co.), Carboxymethyl cellulose (from Polyscience etc.), another wetting and dispersing additives disclosed in for examples, "Marc Thiry et. al., ACSNANO, American Chemical society, Vol. 5, No. 6, pp 4965-4973, 2011", "Kimihiro Susumu, et. al., J. Am. Chem. Soc. 2011, 133, pp 9480-9496".

Thus, in some embodiments of the present invention, the composition comprises at least the (meth)acrylate monomer of chemical formula (I), the (meth)acrylate monomer of chemical formula (II) and the polymer configured so that said polymer enables to the scattering particles to disperse in the composition, wherein the mixing ratio of the (meth) acrylate monomer of chemical formula (I):the (meth)acrylate monomer of chemical formula (II):the polymer is 10:89:1 to 50:40:10, preferably in the range from 15:82:3 to 30:60:10.

In some embodiment of the present invention, a composition comprises, essentially consisting of or consisting of, at least a polymer derived or derivable from the (meth)acrylate monomers of the composition of the present invention.

In a preferred embodiment of the present invention, said polymer is derived or derivable from all the (meth)acrylate monomers in the composition, for example, at least the (meth)acrylate monomer of chemical formula (I) and/or the (meth)acrylate monomer of chemical formula (II).

Ligands

In some embodiments of the present invention, optionally, the semiconducting light emitting nanoparticle can be directly over coated by one or more ligands, or the outer most surface of the inorganic part of the semiconducting light emitting nanoparticle can be directly coated by the additional ligand and the additional ligand is further coated by the polymer.

As the additional ligands, phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), thiols such as hexadecane thiol and hexane thiol; mercapto carboxylic acids such as mercapto propionic acid and mercaptoundecanoic acid; carboxylic acids such as oleic acid, stearic acid, myristic acid; acetic acid, Polyethylenimine (PEI), monofunctional PEG thiol (mPEG-thiol) or a derivatives of mPEG thiol and a combination of any of these can be used.

Examples of such ligands have been described in, for example, the laid-open international patent application No. WO 2012/059931A.

v) Scattering Particles

According to the present invention, as the scattering particles, publicly known small particles of inorganic oxides such as $SiO_2$, $SnO_2$, CuO, CoO, $Al_2O_3TiO_2$, $Fe_2O_3$, $Y_2O_3$, ZnO, ZnS, MgO; organic particles such as polymerized polystyrene, polymerized PMMA; inorganic hollow oxides such as hollow silica or a combination of any of these; can be used preferably.

In some embodiments of the present invention, the composition comprises iii) at least one semiconducting light emitting nanoparticle comprising a 1st semiconducting nanoparticle, optionally one or more shell layers covering at least a part of the $1^{st}$ semiconducting nanoparticle, preferably the composition has EQE value 23% or more, preferably 24% or more and less than 95%.

According to the present invention, as a transparent polymer, a wide variety of publicly known transparent polymers suitable for optical devices, described in for example, WO 2016/134820A can be used preferably.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

According to the present invention the term "polymer" means a material having a repeating unit and having the weight average molecular weight (Mw) 1000 g/mol, or more.

The molecular weight $M_w$ is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in Differential scanning colorimetry like described in http://pslc.ws/macrog/dsc.htm; Rickey J Seyler, Assignment of the Glass Transition, ASTM publication code number (PCN) 04-012490-50.

For example, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

According to the present invention, publicly known antioxidants, radical quenchers, photo initiators and/or surfactants can be used preferably like described in WO 2016/134820A.

QY Calculation

Quantum Yield (QY) measurements of composition are carried out by using Absolute PL quantum yield spectrometer C9920-02 (Hamamatsu Photonics K.K.), and following formula is used.

Quantum yield (QY)=emitted photon number from the sample/absorbed photon number of the sample.

In order to enhance out-coupling efficiency from an optical medium comprising the semiconducting light emitting nanoparticle, for example, a quantum sized material containing optical film, several methods are proposed, such as incorporating scattering particles in the film and/or the adjacent films, reduce the refractive index of the film by incorporating hollow silica particles, and placing suitable shape structure (cf. Proceedings of SPIE, P. 184, 5519-33, 2004). Among them, placing the structured film upon the quantum materials containing film is the most suitable for large TV application in which local dimming technique is applied to achieve high dynamic range. The scattering particles are detrimental to the dimming technique, since the scattered light causes a color blur and reducing the refractive index of the film enough for a practical level is difficult because of the limited volume for the hollow silica particles. The combination of reducing the refractive index and placing the structured film can be also applied.

Bank Composition ($2^{nd}$ Composition)

the bank (150) is obtained or obtainable from, or a cured layer of the 2nd composition comprises at least (I) an alkaline soluble polymer, (II) a polymerization initiator, and (III) a chemical compound containing at least two (meth) acryloyloxy groups, preferably said composition is a photosensitive composition, preferably said at least two (meth)acryloyloxy groups are two or more acryloyloxy groups, methacryloyloxy groups or a combination of these, preferably the total amount of the chemical compound containing said at least two (meth)acryloyloxy groups based on the total amount of the alkaline soluble polymer is in the range from 5 wt. % to 1,000 wt. %, more preferably from 10 wt. % to 500 wt. %, even more preferably it is from 15 wt. % to 300 wt. % from the viewpoint of compatibility with resin, preferably said chemical compound is a monomer having the molecular weight 2000 or less, more preferably in the range from 2000 to 50, even more preferably from 1000 to 100. Preferably it is relatively smaller than the alkali-soluble polymer from the viewpoint of reactivity.

Here, the term "(meth)acryloyloxy group" is a general term for the acryloyloxy group and the methacryloyloxy group. This compound is a compound that can form a crosslinked structure by reacting with the alkali-soluble polymer. Here, in order to form a crosslinked structure, a compound containing two or more acryloyloxy groups or methacryloyloxy groups, which are reactive groups, is needed, and in order to form a higher-order crosslinked structure, it preferably contains three or more acryloyloxy groups or methacryloyloxy groups.

Further, the (meth)acryloyloxy group-containing compounds can be used alone or in combination of two or more.

Preferably said chemical compound containing at least two (meth)acryloyloxy groups, is a poly acrylate monomer having at least three (meth)acryloyloxy groups, more preferably it is a poly acrylate monomer selected from one or more member of the group consisting of a poly acrylate monomer having three (meth)acryloyloxy groups, a poly acrylate monomer having four (meth)acryloyloxy groups, a poly acrylate monomer having five (meth)acryloyloxy groups, a poly acrylate monomer having six (meth)acryloyloxy groups, even more preferably it is a poly acrylate monomer having five (meth)acryloyloxy groups, a poly acrylate monomer having six (meth)acryloyloxy groups or a mixture of thereof, preferably said poly acrylate monomer having three (meth)acryloyloxy groups is selected from one or more member of the group consisting of trimethylolpropane triacrylate, trimethylolpropaneethoxy triacrylate, trimethylolpropanepropoxy triacrylate, glycerinpropoxy triacrylate, pentaerythritol triacrylates;

preferably said poly acrylate monomer having four (meth) acryloyloxy groups is selected from one or more member of the group consisting of pentaerythritol tetraacrylates, ditrimethylolpropane tetraacrylate, pentaerythritolehoxy tetraacrylates;

preferably said poly acrylate monomer having five (meth) acryloyloxy groups is dipentaerythritol hexaacrylates, preferably said poly acrylate monomer having six (meth)acryloyloxy groups is dipentaerythritol pentaacrylate, the most preferably said chemical compound is dipentaerythritol hexaacrylates, dipentaerythritol pentaacrylate or a mixture of thereof.

Alkali-Soluble Polymer

The composition according to the present invention comprises an alkali-soluble polymer.

The alkali-soluble polymer used in the present invention preferably comprises an acryloyl group. Further, the alkali-soluble polymer used in the present invention is not particularly limited, and is preferably selected from a polysiloxane containing a siloxane bond in its main skeleton, and a (meth)acrylate polymer. Among them, it is more preferable to use a methacrylate polymer, an acrylate polymer or a combination of thereof, even more preferably it is an acrylate polymer The alkali-soluble polymer used in the present invention can have a carboxyl group. By having a carboxyl group, the solubility of the alkali-soluble polymer in a low-concentration developer can be improved.

According to the present invention, the term "Alkali-soluble polymer" means a polymer soluble in 2.38% TMAH aqueous solution at 23.0±0.1° C.

(Meth)Acrylate Polymer

Here, the term "(meth)acrylate" is a general term for an acrylate and a methacrylate.

According to the present invention, when a low-concentration developer is used and/or low curing temperature is applied, it is preferable to use one or more of (meth)acrylate polymers.

The alkali-soluble polymer used in the present invention can be selected from generally used methacrylate polymer, an acrylate polymer or a combination of thereof, more preferably it is an acrylic polymer, for example, polyacrylic acid, polymethacrylic acid, polyalkyl acrylate, polyalkyl methacrylate, and the like. The acrylic polymer used in the present invention preferably comprises a repeating unit containing an acryloyl group, and also preferably further comprises a repeating unit containing a carboxyl group and/or a repeating unit containing an alkoxysilyl group.

Although the repeating unit containing a carboxyl group is not particularly limited as long as it is a repeating unit containing a carboxyl group at its side chain, a repeating unit derived from an unsaturated carboxylic acid, an unsaturated carboxylic anhydride or a mixture thereof is preferable.

Although the repeating unit containing an alkoxysilyl group can be a repeating unit containing an alkoxysilyl group at its side chain, it is preferably a repeating unit derived from a monomer represented by the following formula (B):

$$X^B—(CH_2)_a—Si(OR^B)_b(CH_3)_{3-b} \quad (B)$$

wherein, $X^B$ is a vinyl group, a styryl group or a (meth)acryloyloxy group, $R^B$ is a methyl group or an ethyl group, a is an integer of 0 to 3, and b is an integer of 1 to 3.

Further, it is preferable that the above-described polymer contains a repeating unit containing a hydroxyl group, which is derived from a hydroxyl group-containing unsaturated monomer.

The mass average molecular weight of the alkali-soluble polymer according to the present invention is not particularly limited, and preferably it is in the range from 1,000 to 100,000, more preferably it is from 1,200 to 80,000, even more preferably 1,000 to 40,000, furthermore preferably 2,000 to 30,000. Here, the mass average molecular weight is a mass average molecular weight in terms of polystyrene according to gel permeation chromatography. In addition, as far as the number of acid groups is concerned, preferably the solid-acid value of the alkaline soluble polymer is in the range from 10 to 500 mg KOH/g, more preferably it is from 20 to 300 mg KOH/g, even more preferably from 40 to 190 mgKOH/g, furthermore preferably 60 to 150 mgKOH/g, from the viewpoint of enabling development with a low-concentration alkaline developer and achieving both reactivity and storage stability. For examples, 2-Propenoic acid, 2-methyl-, polymer with 2-hydroxyethyl 2-methyl-2-propenoate, 2-isocyanatoethyl 2-propenoate and methyl 2-methyl-2-propenoate (C6 H10 O3·C6 H7 N O3·C5 H8 O2·C4 H6 O2)x (CAS Registry Number 1615232-03-05) can be used preferably.

Polysiloxane

The alkali-soluble polymer preferably contains a siloxane (Si—O—Si) bond as its main skeleton. In the present invention, polymer containing a siloxane bond as its main skeleton is referred to as polysiloxane. Depending on the number of the oxygen atoms bonded to a silicon atom, the skeleton structure of polysiloxane can be classified as follows: a silicone skeleton (the number of oxygen atoms bonded to a silicon atom is 2), a silsesquioxane skeleton (the number of oxygen atoms bonded to a silicon atom is 3), and a silica skeleton (the number of oxygen atoms bonded to a silicon atom is 4). In the present invention, any of these can be used. The polysiloxane molecule can contain a combination of a plurality of these skeletal structures. Preferably, polysiloxane used in the present invention contains a silsesquioxane skeleton.

Polysiloxane generally has a silanol group or an alkoxysilyl group. Such silanol group and alkoxysilyl group mean a hydroxyl group and alkoxy group directly bonded to a silicon that forms a siloxane skeleton. Here, the silanol group and alkoxysilyl group are considered to contribute to the reaction with the silicon-containing compound described below, in addition to the action of accelerating the curing reaction when forming a cured film using the composition. For this reason, it is preferable that polysiloxane has these groups. As to such polysiloxane and/or (meth)acrylate polymer, publicly available one can be used preferably. Or polysiloxane and/or (meth)acylate polymer like disclosed in WO2021/018972 A1 can be used preferably.

In some embodiments, a mixture of the polysiloxane and acrylic polymer can be used as the alkali-soluble polymer.

Further, a cured film is formed through application of the composition according to the present invention onto a substrate, imagewise exposure, and development. At this time, it is necessary that a difference in solubility occurs between the exposed area and the unexposed area, and the coating film in the unexposed area should have a certain or more solubility in a developer. For example, it is considered that a pattern can be formed by exposure and development if dissolution rate of the coating film after prebaked, in a 2.38% tetramethylammonium hydroxide (hereinafter sometimes referred to as TMAH) aqueous solution (hereinafter sometimes referred to as alkali dissolution rate or ADR, which is described later in detail) is 50 Å/sec or more. However, since the required solubility varies depending on the film thickness of the cured film to be formed and the development conditions, the alkali-soluble polymer should be appropriately selected according to the development conditions. Although it varies depending on the type and addition amount of the photosensitizer or the silanol catalyst contained in the composition, for example, if the film thickness is 0.1 to 100 μm (1,000 to 1,000,000 Å), the dissolution rate in a 2.38% TMAH aqueous solution is preferably 50 to 20,000 Å/sec, and more preferably 100 to 10,000 Å/sec.

[Measurement of Alkaline Dissolution Rate (ADR) and Calculation Method Thereof]

Using a TMAH aqueous solution as an alkaline solution, the alkali dissolution rate of the alkali-soluble polymer is measured and calculated as described below.

The alkali-soluble polymer is diluted with propylene glycol monomethyl ether acetate (hereinafter referred to as PGMEA) so as to be 35 mass % and dissolved while stirring at room temperature with a stirrer for 1 hour. In a clean room under an atmosphere of temperature of 23.0±0.5° C. and humidity of 50±5.0%, using a pipette, 1 cc of the prepared alkali-soluble polymer solution is dropped on the center area of a 4-inch silicon wafer having a thickness of 525 μm and spin-coated to make a film having a thickness of 2±0.1 μm, and then the film is heated on a hot plate at 100° C. for 90 seconds to remove the solvent. The film thickness of the coating film is measured with a spectroscopic ellipsometer (manufactured by J. A. Woollam).

Next, the silicon wafer having this film is gently immersed in a glass petri dish having a diameter of 6 inches, into which 100 ml of a TMAH aqueous solution adjusted to 23.0±0.1° C. and having a predetermined concentration was put, then allowed to stand, and the time until the coating film disappears is measured. The dissolution rate is determined by dividing by the time until the film in the area of 10 mm inside from the wafer edge disappears.

In the case that the dissolution rate is remarkably slow, the wafer is immersed in a TMAH aqueous solution for a certain period and then heated for 5 minutes on a hot plate at 200° C. to remove moisture taken in the film during the dissolution rate measurement. Thereafter, film thickness is measured, and the dissolution rate is calculated by dividing the amount of change in film thickness before and after the immersion, by the immersion time. The above measurement method is performed 5 times, and the average of the obtained values is taken as the dissolution rate of the alkali-soluble polymer.

Polymerization Initiator

The composition according to the present invention comprises a polymerization initiator. The polymerization initiator includes a polymerization initiator that generates an acid, a base or a radical by radiation, and a polymerization initiator that generates an acid, a base or a radical by heat. In the present invention, the former is preferable and the photo radical generator is more preferable, in terms of process shortening and cost since the reaction is initiated immediately after the radiation irradiation and the reheating process performed after the radiation irradiation and before the developing process can be omitted.

The photo radical generator can improve the resolution by strengthening the pattern shape or increasing the contrast of development. The photo radical generator used in the present invention is a photo radical generator that emits a radical when irradiated with radiation. Here, examples of the radiation include visible light, ultraviolet light, infrared light, X-ray, electron beam, α-ray, and γ-ray.

The addition amount of the photo radical generator is preferably 0.001 to 50 mass %, more preferably 0.01 to 30 mass %, based on the total mass of the alkali-soluble polymer, though the optimal amount thereof depends on the type and amount of active substance generated by decomposition of the photo radical generator, the required photosensitivity, and the required dissolution contrast between the exposed area and unexposed area. If the addition amount is less than 0.001 mass %, the dissolution contrast between the exposed area and unexposed portion is too low, and the addition effect is not sometimes exhibited. On the other hand, when the addition amount of the photo radical generator is more than 50 mass %, colorless transparency of the coated film sometimes decreases, because it sometimes occurs that cracks are generated in the coated film to be formed and coloring due to decomposition of the photo radical generator becomes remarkable. Further, when the addition amount becomes large, thermal decomposition of the photo radical generator causes deterioration of the electrical insulation of the cured product and release of gas, which sometimes become a problem in subsequent processes. Further, the resistance of the coated film to a photoresist stripper containing monoethanolamine or the like as a main component sometimes deteriorates.

Examples of the photo radical generator include azo-based, peroxide-based, acylphosphine oxide-based, alkylphenone-based, oxime ester-based, and titanocene-based initiators. Among them, alkylphenone-based, acylphosphine oxide-based and oxime ester-based initiators are preferred, and 2,2-dimethoxy-1,2-diphenylethan-1-one, 1-hydroxy-cyclohexylphenyl ketone, 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl)-benzyl]phenyl}-2-methylpropan-1-one, 2-methyl-1-(4-methylthiophenyl)-2-morpholinopropan-1-one, 2-benzyl-2-dimethylamino-1-(4-morpholinophenyl)-1-butanone, 2-(dimethylamino)-2-[(4-methylphenyl)methyl]-1-[4-(4-morpholinyl)-phenyl]-1-butanone, 2,4,6-trimethylbenzoyldiphenyl phosphine oxide, bis (2,4,6-trimethylbenzoyl)-phenyl-phosphine oxide, 1,2-octanedione, 1-[4-(phenylthio)-2-(O-benzoyloxime)], ethanone, 1-[9-ethyl-6-(2-methylbenzoyl)-9H-carbazol-3-yl]-1-(O-acetyloxime), and the like are included.

Surfactant

Further, the composition according to the present invention can optionally comprise a surfactant. Preferably it is a nonionic surfactant, preferably said nonionic surfactant is a hydrocarbon based nonionic surfactant, fluorine-based nonionic surfactant, such as Fluorad (trade name, 3M Japan Limited), Megafac (trade name, DIC Corporation), Surflon (trade name, AGC Inc.), organosilicon based nonionic surfactant, such as KP341 (trade name, Shin-Etsu Chemical Co., Ltd.) or a combination of these, more preferably said hydrocarbon based nonionic surfactant is selected from one or more members the group consisting of polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol such as 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-di-methyl-3-hexyne-2,5-diol, 2,5-di-methyl-2,5-hexanediol; polyethoxylate of acetylene alcohol; acetylene glycol derivatives, such as polyethoxylate of acetylene glycol; preferably fluorine-based nonionic surfactant is selected from one or more of fluorine-containing surfactants; preferably said hydrocarbon based nonionic surfactant is selected from organosiloxane surfactants, preferably the surfactant is a fluorine-based nonionic surfactant. Especially, Megafac RS series (trade name, DIC Corporation) is the most suitable one for the present invention from the view point of realizing improved hydrophobic bank surface, and/or realizing improved oil-repellent bank surface (especially realizing an oil-repellent surface of the top part of a bank after fabrication of it).

Preferably the total amount of the surfactant is in the range from 0.001 to 5 wt. %, more preferably from 0.01 to 4 wt. %, even more preferably from 0.05 to 3 wt. %, furthermore preferably from 0.1 to 1 wt. % based on the total amount of the total solid contents of the $2^{nd}$ composition (bank composition).

The surfactant is added for the purpose of improving coating properties, developability, realizing improved hydrophobic bank surface, and/or realizing improved oil-repellent bank surface.

Saccharide

In a preferred embodiment of the present invention, the $2^{nd}$ composition further comprises a saccharide, preferably the total amount of the surfactant is in the range from 0.001 to 1 wt. %, more preferably from 0.1 to 60 wt. %, even more preferably from 1 to 40 wt. %, furthermore preferably from 10 to 30 wt. % based on the total solid contents of the $2^{nd}$ composition.

According to the study of the present inventors, it has been found that such a saccharide has a dissolution promoting effect in a developer. It is considered that saccharide is dissolved in the solvent in the composition and dissolved also in the developer, thus having a dissolution promoting effect, because it has hydrophilicity and hydrophobicity. Such an effect is particularly beneficial when the development of the composition according to the present invention is carried out with a low-concentration developer.

In a preferred embodiment of the present invention, said saccharide is selected from a monosaccharide, an oligosaccharide, a polysaccharide or a mixture of thereof, more preferably it is an oligosaccharide, even more preferably said saccharide is an oligosaccharide formed by dehydrating and condensing 2 to 10 molecules of a monosaccharide, and also includes a cyclic oligosaccharide (for example, cyclodextrin), furthermore preferably it is cyclodextrin or disaccharide obtained by condensing two molecules of monosaccharide, even more preferably it is a disaccharide obtained by condensing two molecules of monosaccharide, furthermore preferably the saccharide is oligosaccharide having an alkylene oxide having 1 to 6 carbon atoms, more preferably it has an alkylene oxide having 2 to 5 carbon atoms, and further preferably it has an ethylene oxide or propylene oxide, particularly preferably it is sucrose-alkyleneoxide-lauric acid ester.

Colorant

In a preferred embodiment of the present invention, the $2^{nd}$ composition further comprises a colorant, preferably the total amount of said colorant is 3 to 80 wt. %, preferably 5 to 50 wt. % based on the total amount of the solid contents of the $2^{nd}$ composition.

Preferably said colorant is an organic colorant and/or an inorganic colorant, more preferably it is a black colorant selected from an organic black pigment and/or inorganic black pigment, preferably said black colorant has a light transmittance ratio represented by [light transmittance at the wavelength of 365 nm]/[light transmittance at the wavelength of 500 nm] of 1.2 or more, more preferably the ratio is 2.0 or more, preferably said black colorant has a light transmittance ratio represented by [light transmittance at the wavelength of 365 nm]/[light transmittance at the wavelength of 500 nm] of 5.0 or less, even more preferably it is in the range from 1.2 to 5.0, further more preferably it is from 2.0 to 4.0 provided that the transmittance is obtained by measuring a film obtained by the following steps: applying a composition in which 10 mass % of a black colorant is dispersed based on the total amount of the resin forming a film having a film thickness of 10 μm by applying said composition to a glass substrate, and curing at 100° C., then the obtained film is measured using UV-vis-NIR (Hitachi High-Technologies Corporation), preferably said inorganic black pigment is zirconium nitride, preferably said organic black pigment is a mixture of two or more organic color pigments, more preferably it is a mixture of red, green blue organic color pigments configured to show black color by mixing, further more preferably said organic black pigment is a mixture selected from the group consisting of an azo type, a phthalocyanine type, a quinacridone type, a benzimidazolone type, an isoindolinone type, a dioxazine type, an indanthrene type and a perylene type organic pigments, particularly preferably said organic black pigment is a mixture of one selected from the group consisting of C. I. Pigment Orange 43, C. I. Pigment Orange 64 and C. I. Pigment Orange 72, with C. I. Pigment Blue 60, C. I. Pigment Green 7, C. I. Pigment Green 36 and C. I. Pigment Green 58.

As the colorant used in the present invention (preferably black colorant), either an inorganic pigment or an organic pigment, or a combination of two or more pigments can be used as long as it satisfies the required absorbance.

When an organic type black colorant is used in the bank, it is preferable to combine two or more organic pigments to obtain a black colorant. For examples, by mixing respective colors of red, green and blue organic pigments, a black color colorant can be obtained.

The colorant used in the present invention can be used in combination with a dispersant. As the dispersant, an organic compound-based dispersant such as a polymer dispersant described, for example, in JP-A 2004-292672 can be used.

Solvent

In a preferred embodiment of the present invention, the $2^{nd}$ composition further comprises a solvent.

The type solvent is not particularly limited and publicly available solvents can be used as long as it can uniformly dissolve or disperse the above-described alkali-soluble polymer, the polymerization initiator and a chemical compound containing at least two (meth)acryloyloxy groups.

Preferably said solvent is selected from one or more of the members of the group consisting of ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether and propylene glycol monoethyl ether; propylene glycol alkyl ether acetates such as PGMEA, propylene glycol monoethyl ether acetate and propylene glycol monopropyl ether acetate; aromatic hydrocarbons, such as benzene, toluene and xylene; ketones, such as methyl ethyl ketone, acetone, methyl amyl ketone, methyl isobutyl ketone and cyclohexanone; alcohols, such as ethanol, propanol, butanol, hexanol, cyclohexanol, ethylene glycol and glycerin; esters, such as ethyl lactate, ethyl 3-ethoxypropionate, methyl 3-methoxypropionate; and cyclic esters, such as γ-butyrolactone, more preferably said solvent is a combination of propylene glycol alkyl ether acetates or esters, and cyclic esters, such as γ-butyrolactone, preferably the total amount of said solvent based on the total amount of the composition is in the range from 1 wt. % to 99 wt. %, preferably from 5 wt. % to 90 wt. %, even more preferably from 10 wt. % to 80 wt. %, furthermore preferably from 20 wt. % to 70 wt. %.

Other Additives

The composition according to the present invention can optionally comprise other additives. As such additives, a developer dissolution accelerator, a scum remover, an adhesion enhancer, a polymerization inhibitor, an antifoaming agent, a surfactant, a photosensitizing enhancing agent, a crosslinking agent, a curing agent can be added.

Thus, according to the present invention, preferably the $2^{nd}$ composition further comprises at least one additive selected from one or more members of the group consisting of a developer dissolution accelerator, a scum remover, an adhesion enhancer, a polymerization inhibitor, an antifoaming agent, a surfactant, a photosensitizing enhancing agent, a crosslinking agent, and/or a curing agent.

The developer dissolution accelerator or scum remover has a function of adjusting the solubility of the formed coated film in the developer and preventing scum from remaining on the substrate after development. As such an additive, crown ether can be used. The crown ether having the simplest structure is represented by the general formula $(-CH_2-CH_2-O-)_n$. Preferred in the present invention are those in which n is 4 to 7. When x is set to be the total number of atoms constituting the ring and y is set to be the number of oxygen atoms contained therein, the crown ether is sometimes called x-crown-y-ethers. In the present invention, preferred is selected from the group consisting of crown ethers, wherein x=12, 15, 18 or 21, and y=x/3, and their benzo condensates and cyclohexyl condensates. Specific examples of more preferred crown ethers include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclo-hexyl-15-crown-5-ether, and dicyclohexyl-12-crown-4-ether. In the present invention, among them, most preferred is selected from 18-crown-6-ether and 15-crown-5-ether. The content thereof is preferably 0.05 to 15 mass %, more preferably 0.1 to 10 mass %, based on the total mass of the alkali-soluble polymer.

The adhesion enhancer has an effect of preventing a pattern from peeling off due to stress applied after baking when a cured film is formed using the composition according to the present invention. As the adhesion enhancer, imidazoles, silane coupling agents, and the like are preferred. Among imidazoles, 2-hydroxybenzimidazole, 2-hydroxyethylbenzimidazole, benzimidazole, 2-hydroxyimidazole, imidazole, 2-mercaptoimidazole and 2-aminoimidazole are preferable, and 2-hydroxybenzimidazole, benzimidazole, 2-hydroxyimidazole and imidazole are particularly preferably used.

As the silane coupling agent, known ones are suitably used, and examples thereof include epoxy silane coupling agents, amino silane coupling agents, mercapto silane coupling agents, and the like. Specifically, 3-glycidoxypropyltrimethoxysilane, 3-glycidoxypropyl-triethoxysilane, N-2-(aminoethyl)-3-aminopropyltri-methoxysilane, N-2-(aminoethyl)-3-aminopropyltri-ethoxysilane, 3-aminopropyltrimethoxysilane, 3-amino-propyltriethoxysilane, 3-ureidopropyltriethoxysilane, 3-chloropropyltriethoxysilane, 3-mercaptopropyltri-methoxysilane, 3-isocyanatopropyltriethoxysilane, and the like are preferred. These can be used alone or in combination of two or more, and the addition amount thereof is preferably 0.05 to 15 mass % based on the total mass of the alkali-soluble polymer.

Further, as the silane coupling agent, a silane compound and siloxane compound having an acid group, or the like can be used. Examples of the acid group include a carboxyl group, an acid anhydride group, a phenolic hydroxyl group, and the like. When it contains a monobasic acid group such as a carboxyl group or a phenolic hydroxyl group, it is preferred that a single silicon-containing compound has a plurality of acid groups.

Exemplified embodiments of such a silane coupling agent include a compound represented by the formula (C):

$$X_nSi(OR^{C3})_{4-n} \quad (C)$$

or polymer obtained using it as a repeating unit. At this time, a plurality of repeating units having different X or $R^{C3}$ can be used in combination.

In the formula, $R^{C3}$ includes a hydrocarbon group, for example, an alkyl group such as a methyl group, an ethyl group, an n-propyl group, an isopropyl group, and an n-butyl group. In the general formula (C), a plurality of $R^{C3}$ are included, and each $R^{C3}$ can be identical or different.

As X, those having an acid group such as phosphonium, borate, carboxyl, phenol, peroxide, nitro, cyano, sulfo, and alcohol group are included, and those in which these acid groups are protected by acetyl, aryl, amyl, benzyl, methoxymethyl, mesyl, tolyl, trimethoxysilyl, triethoxysilyl, triisopropylsilyl or trityl group, and an acid anhydride group are included.

Among them, a compound having a methyl group as $R^{C3}$ and a carboxylic acid anhydride group as X, such as an acid anhydride group-containing silicone, is preferable. More specifically, a compound represented by the following formula (X-12-967C (trade name, Shin-Etsu Chemical Co., Ltd.)) or polymer containing a structure corresponding thereto in its terminal or side chain of a silicon-containing polymer such as silicone is preferred.

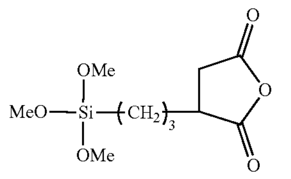

Further, a compound in which thiol, phosphonium, borate, carboxyl, phenol, peroxide, nitro, cyano, and an acid group such as sulfo group is provided at the terminal of dimethyl silicone is also preferable. As such a compound, compounds represented by the following formulae (X-22-2290AS and X-22-1821 (trade name in every case, Shin-Etsu Chemical Co., Ltd.)) are

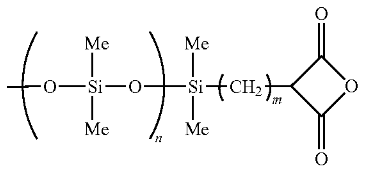

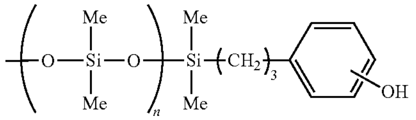

included.

When the silane coupling agent has a silicone structure, if the molecular weight is too large, the compatibility with polysiloxane contained in the composition becomes poor, so that there is a possibility that there is an adverse effect such that the solubility in the developer does not improve, the reactive group remains in the film, and the chemical resistance that can withstand the subsequent process cannot be maintained. For this reason, the mass average molecular weight of the silane coupling agent is preferably 5,000 or less, and more preferably 4,000 or less. The content of the silane coupling agent is preferably 0.01 to 15 mass % based on the total mass of the alkali-soluble polymer.

As the polymerization inhibitor, an ultraviolet absorber as well as nitrone, nitroxide radical, hydroquinone, catechol, phenothiazine, phenoxazine, hindered amine and derivatives thereof can be added. Among them, methylhydroquinone, catechol, 4-t-butylcatechol, 3-methoxycatechol, phenothiazine, chlorpromazine, phenoxazine, TINUVIN 144, 292 and 5100 (BASF) as the hindered amine, and TINUVIN 326, 328, 384-2, 400 and 477 (BASF) as the ultraviolet absorber are preferred. These can be used alone or in combination of two or more, and the content thereof is preferably 0.01 to 20 mass % based on the total mass of the alkali-soluble polymer.

As the antifoaming agent, alcohols ($C_{1-18}$), higher fatty acids such as oleic acid and stearic acid, higher fatty acid esters such as glycerin monolaurate, polyethers such as polyethylene glycols (PEG) (Mn: 200 to 10,000) and polypropylene glycols (PPG) (Mn: 200 to 10,000), silicone compounds such as dimethyl silicone oil, alkyl-modified silicone oil and fluorosilicone oil, and organosiloxane-based surfactants described in detail below are included. These can be used alone or in combination of a plurality of these, and the content thereof is preferably 0.1 to 3 mass % based on the total mass of the alkali-soluble polymer.

Photosensitizing Enhancing Agent

A photosensitizing enhancing agent can be optionally added to the bank composition according to the present invention. The photosensitizing enhancing agent preferably used in the composition according to the present invention includes coumarin, ketocoumarin and their derivatives, thiopyrylium salts, acetophenones, and the like, and specifically, p-bis(o-methylstyryl) benzene, 7-dimethylamino-4-methylquinolone-2,7-amino-4-methylcoumarin, 4,6-di-methyl-7-ethylaminocoumarin, 2-(p-dimethylamino-styryl)-pyridylmethyl-iodide, 7-diethylaminocoumarin, 7-diethylamino-4-methyl-coumarin, 2,3,5,6-1H,4H-tetrahydro-8-methylquinolizino-<9,9a,1-gh> coumarin, 7-diethylamino-4-trifluoromethylcoumarin, 7-dimethyl-amino-4-trifluoromethylcoumarin, 7-amino-4-trifluoro-methylcoumarin, 2,3,5,6-1H,4H-tetrahydroquinolizino-<9,9a,1-gh> coumarin, 7-ethylamino-6-methyl-4-trifluoromethylcoumarin, 7-ethylamino-4-trifluoro-methylcoumarin, 2,3,5,6-1H,4H-tetrahydro-9-carbo-ethoxyquinolizino-<9,9a,1-gh> coumarin, 3-(2'-N-methylbenzimidazolyl)-7-N,N-diethylaminocoumarin, N-methyl-4-trifluoro-methylpiperidino-<3,2-g> coumarin, 2-(p-dimethylaminostyryl)-benzothiazolylethyl iodide, 3-(2'-benzimidazolyl)-7-N,N-diethylaminocoumarin, 3-(2'-benzothiazolyl)-7-N,N-diethylaminocoumarin, and sensitizing dyes such as pyrylium salts and thiopyrylium salts represented by the following chemical formula. By the addition of the sensitizing dye, patterning using an inexpensive light source such as a high-pressure mercury lamp (360 to 430 nm) becomes possible. The content thereof is preferably 0.05 to 15 mass %, more preferably 0.1 to mass %, based on the total mass of the alkali-soluble polymer.

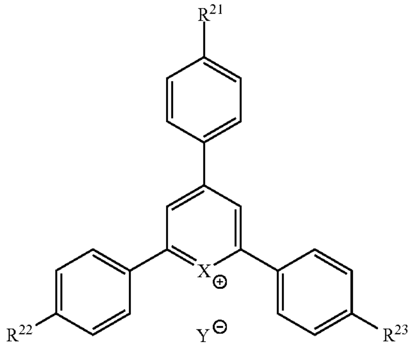

| X | $R^{21}$ | $R^{22}$ | $R^{23}$ | Y |
|---|---|---|---|---|
| S | $OC_4H_8$ | H | H | $BF_4$ |
| S | $OC_4H_8$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_8$ | H | H | $SbF_5$ |

Further, as the photosensitizing enhancing agent, an anthracene skeleton-containing compound can be also used. Specifically, a compound represented by the following formula is included.

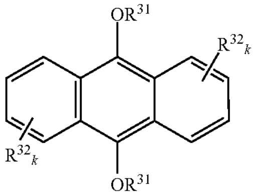

wherein, $R^{31}$ each independently represents a substituent selected from the group consisting of an alkyl group, an aralkyl group, an allyl group, a hydroxyalkyl group, an alkoxyalkyl group, a glycidyl group, and a halogenated alkyl group, $R^{32}$ each independently represents a substituent selected from the group consisting of a hydrogen atom, an alkyl group, an alkoxy group, a halogen atom, a nitro group, a sulfonic acid group, a hydroxyl group, an amino group, and a carboalkoxy group, and k is each independently selected from 0 and an integer of 1 to 4.

When such a photosensitizing enhancing agent having an anthracene skeleton is used, its content is preferably 0.01 to 5 mass % based on the total mass of the alkali-soluble polymer.

Optical Device

In another aspect, the invention further relates to an optical device (300, 400, 500) containing at least one color conversion device (100) and a functional medium (320, 420, 520) configured to modulate a light or configured to emit light.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

Figure 4:
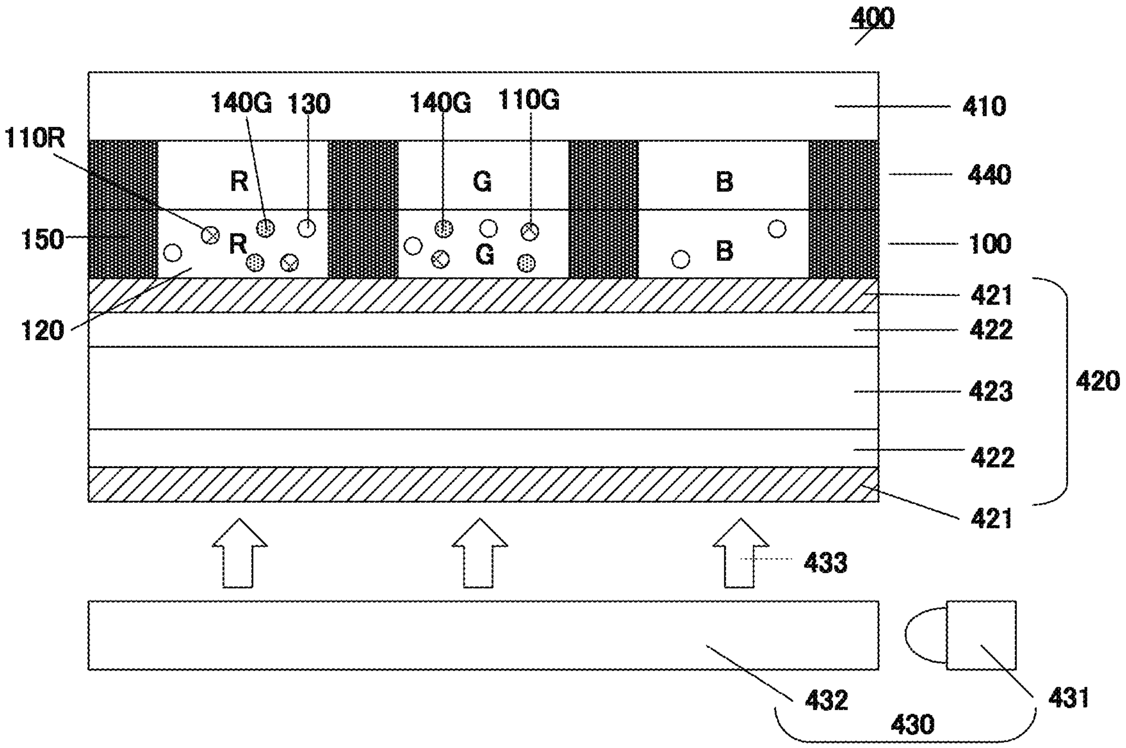
FIG. 4: shows a cross sectional view of a schematic of another embodiment of an optical device (300) of the invention.
Figure 5:
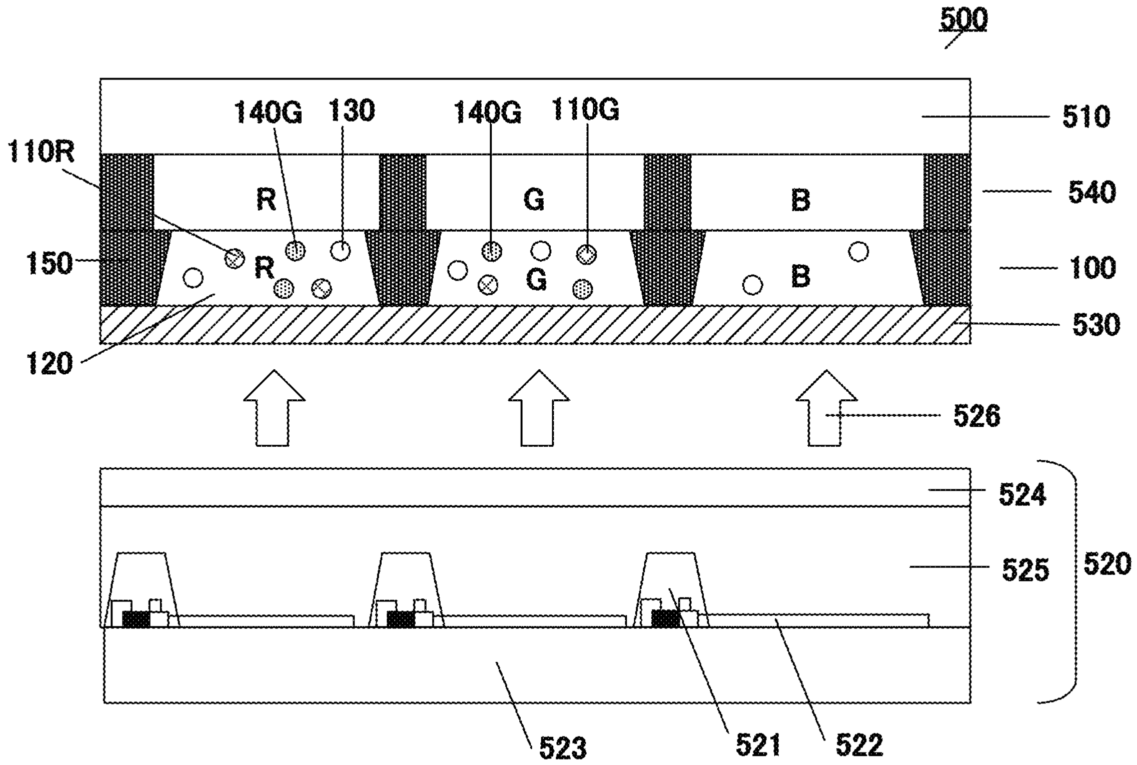
FIG. 5: shows a cross sectional view of a schematic of another embodiment of an optical device (300) of the invention.
Figure 6:
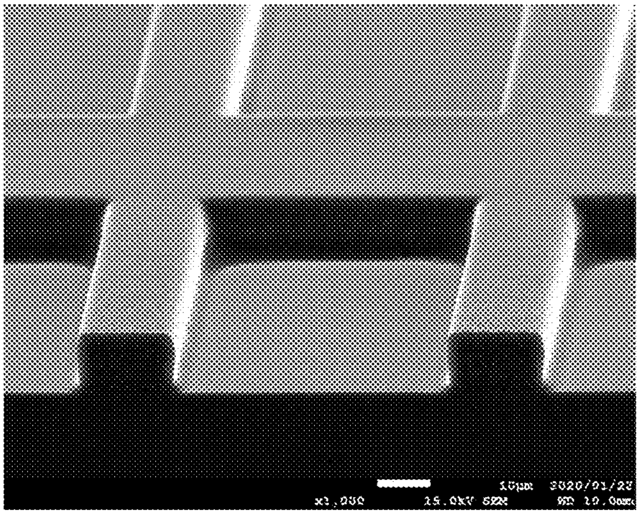
FIG. 6: shows the results of the Cross Section SEM analysis of the samples 1 and 2

FIGS. 4 to 6 show some embodiments of the optical device of the present invention.

The term "emission" means the emission of electromagnetic waves by electron transitions in atoms and molecules.

Process

In another aspect, the invention also relates to a process for fabricating the composition of the present invention comprising, essentially consisting or consisting of:

a) mixing at least i) at least one (meth)acrylate monomer represented by following chemical formula (I) and ii) another material;

(I)

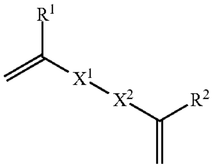

wherein $X^1$ is a non-substituted or substituted alkyl group, aryl group or an alkoxy group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

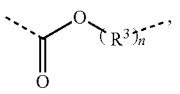

wherein n is 0 or 1;

preferably the symbol $X^2$ is

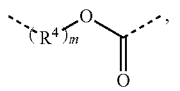

wherein m is 0 or 1;

$R^3$ is a straight alkylene chain or alkoxylene chain having 1 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C═O, C═S, C═Se, C═$NR^a$, P(═O)($R^a$), SO, $SO_2$, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C═O, C═S, C═Se, C═$NR^a$, P(═O)($R^a$), SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another, to get a composition.

Preferably said another material is a (meth)acrylate monomer represented by following chemical formula (II);

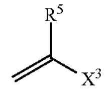

(II)

$X^3$ is a non-substituted or substituted alkyl group, aryl group or an alkoxy group;

preferably the symbol $X^3$ is

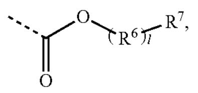

wherein l is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C═O, C═S, C═Se, C═$NR^a$, P(═O)($R^a$), SO, $SO_2$, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C═O, C═S, C═Se, C═$NR^a$, P(═O)($R^a$), SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

Preferably, the mixing ratio of the (meth)acrylate monomer of chemical formula (I) to the (meth)acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 35:65, preferably at least a purified (meth)acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

Thus, in a preferable embodiment of the present invention, the method comprises a purification step of the (meth) acrylate monomers. More preferably, said purification step is taken place before step a).

More details of (meth)acrylate monomers, another material, polymer and scattering particles are described in the section of "(meth)acrylate monomer", "another material", "polymer" and "scattering particle".

Additional additives as described in the section of "additional material" can be mixed.

According to the present invention, it is desirable not to add any solvent to realize large area inkjet printing with improved uniformity without causing any clogging at a nozzle and/or with good dispersity of semiconducting light emitting nanoparticles and/or with good dispersity of scattering particles.

In another aspect, the present invention also relates to a method for fabricating a color conversion device (100) comprising at least a $1^{st}$ pixel (161) comprising at least a matrix material (120) containing a light emitting moiety (110), and a bank (150) comprising at least a polymer material, containing at least the following steps, preferably in this sequence, Xi) Providing a $2^{nd}$ composition onto a surface of a supporting medium Xii) Curing the $2^{nd}$ composition, Xiii) Applying photo-patterning to the cured said composition to fabricate bank and a patterned pixel reasion, Xiv) Providing a 1st composition to at least one pixel resion, preferably by ink-jetting, Xv) Curing the 1st composition, preferably said color conversion device (100) further contains a supporting medium (170), Y) optionally applying photo curing of (meth)acrylate monomer(s) with UV light irradiation.

Bank Fabrication Process (1) Application Process

First, the above-described composition is applied onto a substrate. Formation of the coating film of the composition in the present invention can be carried out by any method conventionally known as a method for applying a photosensitive composition. Specifically, it can be freely selected from dip coating, roll coating, bar coating, brush coating, spray coating, doctor coating, flow coating, spin coating, slit coating, and the like. Further, as the substrate on which the composition is applied, a suitable substrate such as a silicon substrate, a glass substrate, a resin film, and the like can be used. Various semiconductor devices and the like can be formed on these substrates as needed. When the substrate is a film, gravure coating can also be utilized. If desired, a drying process can be additionally provided after applying the film. Further, if necessary, the applying process can be repeated once or twice or more to make the film thickness of the coating film to be formed as desired.

(2) Pre-Baking Process

After forming the coating film of the composition by applying the composition, it is preferable to carry out pre-baking (heat treatment) of the coating film in order to dry the coating film and reduce the residual amount of the solvent in the coating film. The pre-baking process can be carried out at a temperature of generally 50 to 150° C., preferably 90 to 120° C., in the case of a hot plate, for 10 to 300 seconds, preferably 30 to 120 seconds and in the case of a clean oven, for 1 to 30 minutes.

(3) Exposure Process

After forming a coating film, the coating film surface is then irradiated with light. As the light source to be used for the light irradiation, any one conventionally used for a pattern forming method can be used. As such a light source, a high-pressure mercury lamp, a low-pressure mercury lamp, a lamp such as metal halide and xenon, a laser diode, an LED and the like can be included. As the irradiation light, ultraviolet ray such as g-line, h-line and i-line is usually used. Except ultrafine processing for semiconductors or the like, it is general to use light of 360 to 430 nm (high-pressure mercury lamp) for patterning of several μm to several dozens of μm. The energy of the irradiation light is generally 5 to 2,000 $mJ/cm^2$, preferably 10 to 1,000 $mJ/cm^2$, although it depends on the light source and the film thickness of the coating film. If the irradiation light energy is lower than 5 $mJ/cm^2$, sufficient resolution cannot be obtained in some cases. On the other hand, when the irradiation light energy is higher than 2,000 $mJ/cm^2$, the exposure becomes excess and occurrence of halation is sometimes brought.

In order to irradiate light in a pattern shape, a general photomask can be used. Such a photomask can be freely selected from well-known ones. The environment at the time of irradiation is not particularly limited and can generally be set as an ambient atmosphere (in the air) or nitrogen atmosphere. Further, in the case of forming a film on the entire surface of the substrate, light irradiation can be performed over the entire surface of the substrate. In the present invention, the pattern film also includes such a case where a film is formed on the entire surface of the substrate.

(4) Post Exposure Baking Process

After the exposure, to promote the reaction between the polymer in the film by the polymerization initiator, post exposure baking can be performed as necessary. Different from the heating process (6) to be described later, this heating treatment is performed not to completely cure the coating film but to leave only a desired pattern on the substrate after development and to make other areas capable of being removed by development. Therefore, it is not essential in the present invention.

When the post exposure baking is performed, a hot plate, an oven, a furnace, and the like can be used. The heating temperature should not be excessively high because it is not desirable for the acid, base or radical in the exposed area, which is generated by light irradiation, to diffuse to the unexposed area. From such a viewpoint, the range of the heating temperature after exposure is preferably 40 to 150° C., and more preferably 60 to 120° C. Stepwise heating can be applied as needed to control the curing rate of the composition. Further, the atmosphere during the heating is not particularly limited and can be selected from in an inert gas such as nitrogen, under a vacuum, under a reduced pressure, in an oxygen gas, and the like, for the purpose of controlling the curing rate of the composition. Further, the heating time is preferably above a certain level in order to maintain higher the uniformity of temperature history in the wafer surface and is preferably not excessively long in order to suppress diffusion of the generated acid, base or radical. From such a viewpoint, the heating time is preferably 20 seconds to 500 seconds, and more preferably 40 seconds to 300 seconds.

(5) Developing Process

After post-exposure heating is optionally performed after exposure, the coating film is developed. As the developer to be used at the time of development, any developer conventionally used for developing a photosensitive composition can be used. Preferable examples of the developer include an alkali developer which is an aqueous solution of an alkaline compound such as tetraalkylammonium hydroxide, choline, alkali metal hydroxide, alkali metal metasilicate (hydrate), alkali metal phosphate (hydrate), a sodium carbonate aqueous solution, ammonia, alkylamine, alkanolamine and heterocyclic amine, and a particularly preferable alkali developer is a tetramethylammonium hydroxide aqueous solution, a potassium hydroxide aqueous solution, a sodium hydroxide aqueous solution, or a sodium carbonate aqueous solution. In this alkali developer, a water-soluble organic solvent such as methanol and ethanol, or a surfactant can be further contained, if necessary. In the present invention, the development can be performed using a developer having a lower concentration than a 2.38 mass % TMAH developer that is usually used as a developer. Examples of such a developer include a 0.05 to 1.5 mass TMAH aqueous solution, a 0.1 to 2.5 mass % sodium carbonate aqueous solution, and a 0.01 to 1.5 mass % potassium hydroxide aqueous solution. The developing time is usually 10 to 300 seconds, preferably 30 to 180 seconds. The developing method can also be freely selected from conventionally known methods. Specifically, methods such as dipping in a developer (dip), paddle, shower, slit, cap coat, spray, and the like can be included. After the development with a developer, by which a pattern can be obtained, it is preferable that rinsing with water is carried out.

(6) Heating Process

After development, the obtained pattern film is cured by heating. As the heating apparatus used for the heating process, the same one as used for the above-described post-exposure heating can be used. The heating temperature in this heating process is not particularly limited as long as it is a temperature at which curing of the coating film can be performed, and it can be freely determined. However, if the silanol group of polysiloxane remains, the chemical resistance of the cured film sometimes becomes insufficient, or dielectric constant of the cured film sometimes becomes higher. From such viewpoints, a relatively high temperature is generally selected as the heating temperature. However, the composition according to the invention is capable of being cured at relatively low temperature. Specifically, it is preferable to cure by heating at 350° C. or lower, and in order to maintain a high remaining film ratio after curing, the curing temperature is more preferably 300° C. or lower, and particularly preferably 250° C. or lower. On the other hand, in order to accelerate the curing reaction and obtain a sufficiently cured film, the curing temperature is preferably 70° C. or higher, more preferably 100° C. or higher. According to the present invention, low curing temperature such as around 100° C. is more preferable. Further, the heating time is not particularly limited and is generally 10 minutes to 24 hours, and preferably 30 minutes to 3 hours. In addition, this heating time is a time from when the temperature of the pattern film reaches a desired heating temperature. Usually, it takes about several minutes to several hours for the pattern film to reach a desired temperature from the temperature before heating.

In another aspect, the present invention further relates to the color conversion device (100) obtainable or obtained from the method of the present invention.

In another aspect, the present invention further relates to use of the color conversion device (100) of the present invention in an optical device (300) containing at least one functional medium (320, 420, 520) configured to modulate a light or configured to emit light.

Preferable Embodiments

1. A color conversion device (100) comprising, essentially consisting of, or consisting of, at least a $1^{st}$ pixel (161) comprising at least a matrix material (120) containing a light emitting moiety (110), and a bank (150) comprising at least a polymer material, preferably the color conversion device (100) further contains a supporting medium (170).
2. The device (100) of embodiment 1, wherein the matrix material (120) contains a (meth)acrylate polymer, preferably it is a methacrylate polymer, an acrylate polymer or a combination of thereof, more preferably it is an acrylate polymer, even more preferably said matrix material (120) is obtained or obtainable from a $1^{st}$ composition containing at least one acrylate monomer, further more preferably said matrix material (120) is obtained or obtainable from a $1^{st}$ composition containing at least one di-acrylate monomer, particularly preferably said matrix material (120) is obtained or obtainable from a $1^{st}$ composition containing at least one di-acrylate monomer and a mono-acrylate monomer, preferably said composition is a photosensitive composition.
3. The device (100) of embodiment 1 or 2, wherein said $1^{st}$ pixel (161) is a solid layer obtained or obtainable by curing a $1^{st}$ composition containing at least one acrylate monomer together with at least one light emitting moiety (110), preferably said curing is a photo curing by photo irradiation, thermal curing or a combination of a photo curing and a thermal curing.
4. The device (100) of any one of embodiments 1 to 3, wherein said polymer material is a thermosetting resin, preferably it is a photosensitive resin, more preferably it is a thermosetting and photosensitive resin containing an alkaline soluble polymer, preferably the weight-average molecular weight of said alkaline soluble polymer is in the range from 1,000 to 100,000, more preferably it is from 1,200 to 80,000, preferably the solid-acid value of the alkaline soluble polymer is in the range from 10 to 500 mg KOH/g, more preferably it is from 20 to 300 mg KOH/g, preferably said alkaline soluble polymer is selected from (meth)acrylate polymer, siloxane (meth)acrylate polymer, more preferably it is a methacrylate polymer, an acrylate polymer or a combination of thereof, even more preferably the polymer material is an acrylate polymer, further more preferably said bank (150) is obtained or obtainable from a $2^{nd}$ composition containing at least one alkaline soluble polymer and a chemical compound containing at least two (meth)acryloyloxy groups, particularly preferably said bank (150) is obtained or obtainable from a $2^{nd}$ composition containing at least one alkaline soluble polymer and a chemical compound containing at least two (meth)acryloyloxy groups and a surfactant, preferably said composition is a photosensitive composition, preferably said bank is a cured layer obtained or obtainable from the composition, more preferably said bank is a photolithographically patterned cured layer obtained or obtainable from the composition.
5. The device (100) of any one of embodiments 1 to 4, wherein said bank (150) further contains a surfactant, preferably at least a part of the surface of the bank is covered by said surfactant, more preferably the surface of the bank is hydrophobic, even more preferably the surface of the top part of the bank is oil-repellent, preferably the total amount of the surfactant is in the range from 0.001 to 5 wt. %, more preferably from 0.01 to 4 wt. %, even more preferably from 0.05 to 3 wt. %, furthermore preferably from 0.1 to 1 wt. % based on the total amount of the bank.
6. The device (100) of any one of embodiments 1 to 5, wherein said bank (150) contains a nonionic surfactant, preferably said nonionic surfactant is a hydrocarbon based nonionic surfactant, fluorine-based nonionic surfactant, organosilicon based nonionic surfactant or a combination of these, more preferably said hydrocarbon based nonionic surfactant is selected from one or more members the group consisting of polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol such as 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-di-methyl-3-hexyne-2,5-diol, 2,5-di-methyl-2,5-hexanediol; polyethoxylate of acetylene alcohol; acetylene glycol derivatives, such as polyethoxylate of acetylene glycol; preferably fluorine-based nonionic surfactant is selected from one or more of fluorine-containing surfactants; preferably said hydrocarbon based nonionic surfactant is selected from organosiloxane surfactants, preferably the surfactant is a fluorine-based nonionic surfactant.
7. The device (100) of any one of embodiments 1 to 6, wherein the bank (150) further contains a saccharide, preferably said saccharide is selected from a monosaccharide, an oligosaccharide, a polysaccharide or a mixture of thereof, more preferably it is an oligosaccharide, even more preferably said saccharide is an oligosaccharide formed by dehydrating and condensing 2 to 10 molecules of a monosaccharide, and also includes a cyclic oligosaccharide (for example, cyclodextrin), furthermore preferably it is cyclodextrin or disaccharide obtained by condensing two molecules of monosaccharide, even more preferably it is a disaccharide obtained by condensing two molecules of monosaccharide, furthermore preferably the saccharide is oligosaccharide having an alkylene oxide having 1 to 6 carbon atoms, more preferably it has an alkylene oxide having 2 to 5 carbon atoms, and further preferably it has an ethylene oxide or propylene oxide, particularly preferably it is sucrose-alkyleneoxide-lauric acid ester, preferably the total amount of the surfactant is in the range from 0.001 to 1 wt. %, more preferably from 0.1 to 60 wt. %, even more preferably from 1 to 40 wt. %, furthermore preferably from 10 to 30 wt. % based on the total solid contents of the polymer material.

8. The device (100) of any one of embodiments 1 to 7, wherein the bank (150) further comprises a colorant, preferably said colorant is an organic colorant and/or an inorganic colorant, more preferably it is a black colorant selected from an organic black pigment and/or inorganic black pigment, preferably said black colorant has a light transmittance ratio represented by [light transmittance at the wavelength of 365 nm]/[light transmittance at the wavelength of 500 nm] of 1.2 or more, more preferably the ratio is 2.0 or more, preferably said black colorant has a light transmittance ratio represented by [light transmittance at the wavelength of 365 nm]/[light transmittance at the wavelength of 500 nm] of 5.0 or less, even more preferably it is in the range from 1.2 to 5.0, further more preferably it is from 2.0 to 4.0 provided that the transmittance is obtained by measuring a film obtained by the following steps: applying a composition in which 10 mass of a black colorant is dispersed based on the total amount of the resin forming a film having a film thickness of 10 μm by applying said composition to a glass substrate, and curing at 100° C., then the obtained film is measured using UV-vis-NIR (Hitachi High-Technologies Corporation), preferably said inorganic black pigment is zirconium nitride, preferably said organic black pigment is a mixture of two or more organic color pigments, more preferably it is a mixture of red, green blue organic color pigments configured to show black color by mixing, further more preferably said organic black pigment is a mixture selected from the group consisting of an azo type, a phthalocyanine type, a quinacridone type, a benzimidazolone type, an isoindolinone type, a dioxazine type, an indanthrene type and a perylene type organic pigments, particularly preferably said organic black pigment is a mixture of one selected from the group consisting of C. I. Pigment Orange 43, C. I. Pigment Orange 64 and C. I. Pigment Orange 72, with C. I. Pigment Blue 60, C. I. Pigment Green 7、C. I. Pigment Green 36 and C. I. Pigment Green 58.

9. The device (100) of any one of embodiments 1 to 8, wherein the total amount of said colorant is 3 to 80 wt. %, preferably 5 to 50 wt. % based on the total amount of the polymer material of the bank.

10. The device (100) of any one of embodiments 1 to 9, wherein said light emitting moiety (110) is an organic and/or inorganic light emitting material, preferably it is an organic dye, inorganic phosphor and/or a quantum material.

11. The device (100) of any one of embodiments 1 to 10, wherein the total amount of the light emitting moiety (110) is in the range from 0.1 wt. % to 90 wt. % based on the total amount of the $1^{st}$ pixel (161), preferably from 10 wt. % to 70 wt. %, more preferably from 30 wt. % to 50 wt. %.

12. The device (100) of any one of embodiments 1 to 11, wherein said supporting medium (170) is a substrate, more preferably it is a transparent substrate, even more preferably it is a transparent polymer substrate selected from glass substrate, thin glass substrate stacked on a transparent polymer film, transparent metal oxides (for example, oxide silicone, oxide aluminum, oxide titanium), or a polymer film substrate with transparent metal oxides.

13. The device (100) of any one of embodiments 1 to 12, wherein the height of the bank (150) is in the range from 0.1 to 100 μm, preferably it is from 1 to 50 μm, more preferably from 1 to 25 μm, furthermore preferably from 5 to 20 μm.

14. The device (100) of any one of embodiments 1 to 13, wherein the layer thickness of the pixel (161) is in the range from 0.1 to 100 μm, preferably it is from 1 to 50 μm, more preferably from 5 to 25 μm.

15. The device (100) of any one of embodiments 1 to 14, further contains a $2^{nd}$ pixel (162), preferably the device (100) contains at least said $1^{st}$ pixel (161), $2^{nd}$ pixel (162) and a $3^{rd}$ pixel (163), more preferably said $1^{st}$ pixel (161) is a red color pixel, the $2^{nd}$ pixel (162) is a green color pixel and the $3^{rd}$ pixel (163) is a blue color pixel, even more preferably the $1^{st}$ pixel (161) contains a red light emitting moiety (110R), the 2nd color pixel (162) contains a green light emitting moiety (110G) and the $3^{rd}$ pixel (163) does not contain any light emitting moiety.

16. The device (100) of any one of embodiments 1 to 15, wherein at least one pixel (160) additionally comprises at least one light scattering particle (130) in the matrix material (120), preferably the pixel (160) contains a plurality of light scattering particles (130).

17. The device (100) of any one of embodiments 1 to 16, wherein said $1^{st}$ pixel (161) consists of one pixel or two or more sub-pixels configured to emit red-color when irradiated by an excitation light, more preferably said sub-pixels contains the same light emitting moiety (110).

18. The device (100) of any one of embodiments 1 to 17, wherein the bank (150) is configured to determine the area of said $1^{st}$ pixel (161) and at least a part of the bank (150) is directly contacting to at least a part of the 1st pixel (161), preferably said $2^{nd}$ polymer of the bank (150) is directly contacting to at least a part of the $1^{st}$ polymer of the $1^{st}$ pixel (161).

19. The device (100) of any one of embodiments 1 to 18, wherein said bank (150) is photolithographically patterned and said $1^{st}$ pixel (161) is surrounded by the bank (150), preferably said $1^{st}$ pixel (161), the $2^{nd}$ pixel (162) and the $3^{rd}$ pixel (163) are all surrounded by the photolithographically patterned bank (150).

20. The device (100) of any one of embodiments 1 to 19, wherein the 1st pixel is obtained or obtainable from, or is a cured layer of said 1st composition comprises;

i) at least one (meth)acrylate monomer represented by following chemical formula (I), and ii) another material;

(I)

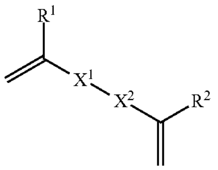

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

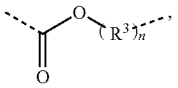

wherein n is 0 or 1;

preferably the symbol $X^2$ is

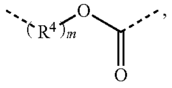

wherein m is 0 or 1;

preferably at least m or n is 1;

$R^3$ is a straight alkylene chain or alkoxylene chain having 1 to 25 carbon atoms, a cycloalkane having 3 to 25 carbon atoms or an alkyl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an alkyl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

21. The device (100) of any one of embodiments 1 to 20, wherein said another material in the 1st composition is a (meth)acrylate monomer represented by following chemical formula (II) which is different from the (meth)acrylate monomer of chemical formula (I);

(II)

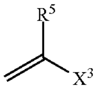

$X^3$ is a non-substituted or substituted alkyl group, aryl group or an alkoxy group;

preferably the symbol $X^3$ is

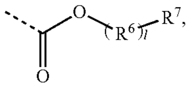

wherein l is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=5, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

22. The device (100) of any one of embodiments 1 to 21, wherein the (meth)acrylate monomer of chemical formula (II) is in the 1st composition and the mixing ratio of the (meth)acrylate monomer of chemical formula (I) to the (meth)acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 35:65, preferably at least a purified (meth) acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

23. The device (100) of any one of embodiments 1 to 22, wherein the boiling point (B.P.) of said (meth)acrylate monomer of chemical formula (I) and/or chemical formula (II) is 250° C. or more, preferably the (meth) acrylate monomers of chemical formula (I) and chemical formula (II) are both 250° C. or more, more preferably it is in the range from 250° C. to 350° C., even more preferably from 280° C. to 350° C., further more preferably from 300° C. to 348° C.

24. The device (100) of any one of embodiments 1 to 23, wherein the viscosity of the $1^{st}$ composition is 35 cP or less at room temperature, preferably in the range from 1 to 35 cP, more preferably from 2 to 30 cP, even more preferably from 2 to 25 cP.

25. The device (100) of any one of embodiments 1 to 24, said 1st composition comprises an additional material selected from one or more members of the group consisting of;

iii) at least one light emitting moiety (110), preferably said light emitting moiety (110) comprises a ligand, more preferably said light emitting moiety (110) comprises an alkyl type ligand having carbon atoms 2 to 25;

iv) another (meth)acrylate monomer;

v) scattering particles (130); and vi) optically transparent polymers, anti-oxidants, radical quenchers, photo initiators and/or surfactants.

26. The device (100) of any one of embodiments 1 to 25, where the 1st composition comprises v) scattering particles (130); and vii) at least one polymer configured so that said polymer enables to the scattering particles to disperse in the composition;

wherein the polymer comprises at least a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the polymer comprises a tertiary amine, phosphine oxide group, phosphonic acid, or a phosphate group.

27. The device (100) of any one of embodiments 1 to 26, wherein the $1^{st}$ composition comprises a solvent 10 wt % or less based on the total amount of the composition, more preferably it is 5 wt % or less, more preferably it is a solvent free composition, preferably the composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol monoalkyl ethers, propylene glycol, and propylene glycol monoalkyl ethers.

28. The device (100) of any one of embodiments 1 to 27, wherein the $1^{st}$ composition comprises at least the (meth)acrylate monomer of chemical formula (I), the (meth)acrylate monomer of chemical formula (II) and the polymer configured so that said polymer enables to the scattering particles to disperse in the composition, wherein the mixing ratio of the (meth)acrylate monomer of chemical formula (I): the (meth)acrylate monomer of chemical formula (II):the polymer is 10:89:1 to 50:40:10, preferably in the range from 15:82:3 to 30:60:10.

29. The device (100) of any one of embodiments 1 to 28, wherein the bank is obtained or obtainable from, or a cured layer of the $2^{nd}$ composition comprises at least (I) an alkaline soluble polymer, (II) a polymerization initiator, and (III) a chemical compound containing at least two (meth) acryloyloxy groups, preferably said composition is a photosensitive composition, preferably said at least two (meth)acryloyloxy groups are two or more acryloyloxy groups, methacryloyloxy groups or a combination of these, preferably the total amount of the chemical compound containing said at least two (meth)acryloyloxy groups based on the total amount of the alkaline soluble polymer is in the range from 5 wt. % to 1,000 wt. %, more preferably from 10 wt. % to 500 wt. %, even more preferably it is from 15 wt. % to 300 wt. %, preferably said chemical compound is a monomer having the molecular weight 2000 or less, more preferably in the range from 2000 to 50, even more preferably from 1000 to 100 preferably it is a poly acrylate monomer having at least three (meth)acryloyloxy groups, more preferably it is a poly acrylate monomer selected from one or more member of the group consisting of a poly acrylate monomer having three (meth)acryloyloxy groups, a poly acrylate monomer having four (meth)acryloyloxy groups, a poly acrylate monomer having five (meth)acryloyloxy groups, a poly acrylate monomer having six (meth) acryloyloxy groups, even more preferably it is a poly acrylate monomer having five (meth)acryloyloxy groups, a poly acrylate monomer having six (meth) acryloyloxy groups or a mixture of thereof, preferably said poly acrylate monomer having three (meth)acryloyloxy groups is selected from one or more member of the group consisting of trimethylolpropane triacrylate, tri methylolpropaneethoxy triacrylate, trimethylolpropanepropoxy triacrylate, glycerinpropoxy triacrylate, pentaerythritol triacrylates;

preferably said poly acrylate monomer having four (meth) acryloyloxy groups is selected from one or more member of the group consisting of pentaerythritol tetraacrylates, ditrimethylolpropane tetraacrylate, pentaerythritolehoxy tetraacrylates;

preferably said poly acrylate monomer having five (meth) acryloyloxy groups is dipentaerythritol hexaacrylates, preferably said poly acrylate monomer having six (meth)acryloyloxy groups is dipentaerythritol pentaacrylate, the most preferably said chemical compound is dipentaerythritol hexaacrylates, dipentaerythritol pentaacrylate or a mixture of thereof.

30. The device (100) of any one of embodiments 1 to 29, wherein the 2nd composition further comprises a surfactant, preferably the total amount of the surfactant is in the range from 0.001 to 5 wt. %, more preferably from 0.01 to 4 wt. %, even more preferably from 0.05 to 3 wt. %, furthermore preferably from 0.1 to 1 wt. % based on the total solid contents of the 2nd composition, preferably said surfactant is a nonionic surfactant, preferably said nonionic surfactant is a hydrocarbon based nonionic surfactant, fluorine-based nonionic surfactant, organosilicon based nonionic surfactant or a combination of these, more preferably said hydrocarbon based nonionic surfactant is selected from one or more members the group consisting of polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol such as 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-di-methyl-3-hexyne-2,5-diol, 2,5-di-methyl-2,5-hexanediol; polyethoxylate of acetylene alcohol; acetylene glycol derivatives, such as polyethoxylate of acetylene glycol; preferably fluorine-based nonionic surfactant is selected from one or more of fluorine-containing surfactants; preferably said hydrocarbon based nonionic surfactant is selected from organosiloxane surfactants, preferably the surfactant is a fluorine-based nonionic surfactant.

31. The device (100) of any one of embodiments 1 to 30, wherein the 2nd composition further comprises a saccharide, preferably the total amount of the surfactant is in the range from 0.001 to 1 wt. %, more preferably from 0.1 to 60 wt. %, even more preferably from 1 to 40 wt. %, furthermore preferably from 10 to 30 wt. % based on the total solid contents of the $2^{nd}$ composition, preferably said saccharide is selected from a monosaccharide, an oligosaccharide, a polysaccharide or a mixture of thereof, more preferably it is an oligosaccharide, even more preferably said saccharide is an oligosaccharide formed by dehydrating and condensing 2 to 10 molecules of a monosaccharide, and also includes a cyclic oligosaccharide (for example, cyclodextrin), furthermore preferably it is cyclodextrin or disaccharide obtained by condensing two molecules of monosaccharide, even more preferably it is a disaccharide obtained by condensing two molecules of monosaccharide, furthermore preferably the saccharide is oligosaccharide having an alkylene oxide having 1 to 6 carbon atoms, more preferably it has an alkylene oxide having 2 to 5 carbon atoms, and further preferably it has an ethylene oxide or propylene oxide, particularly preferably it is sucrose-alkyleneoxide-lauric acid ester.

32. The device (100) of any one of embodiments 1 to 31, wherein the 2nd composition further comprises a colorant, preferably the total amount of said colorant is 3 to 80 wt. %, preferably 5 to 50 wt. % based on the total amount of the solid contents of the $2^{nd}$ composition, preferably said colorant is an organic colorant and/or an inorganic colorant, more preferably it is a black colorant selected from an organic black pigment and/or inorganic black pigment, preferably said black colorant has a light transmittance ratio represented by [light transmittance at the wavelength of 365 nm]/[light transmittance at the wavelength of 500 nm] of 1.2 or more, more preferably the ratio is 2.0 or more, preferably said black colorant has a light transmittance ratio represented by [light transmittance at the wavelength of 365 nm]/[light transmittance at the wavelength of 500 nm] of 5.0 or less, even more preferably it is in the range from 1.2 to 5.0, further more preferably it is from 2.0 to 4.0 provided that the transmittance is obtained by measuring a film obtained by the following steps: applying a composition in which 10 mass % of a black colorant is dispersed based on the total amount of the resin forming a film having a film thickness of 10 μm by applying said composition to a glass substrate, and curing at 100° C., then the obtained film is measured using UV-vis-NIR (Hitachi High-Technologies Corporation), preferably said inorganic black pigment is zirconium nitride, preferably said organic black pigment is a mixture of two or more organic color pigments, more preferably it is a mixture of red, green blue organic color pigments configured to show black color by mixing, further more preferably said organic black pigment is a mixture selected from the group consisting of an azo type, a phthalocyanine type, a quinacridone type, a benzimidazolone type, an isoindolinone type, a dioxazine type, an indanthrene type and a perylene type organic pigments, particularly preferably said organic black pigment is a mixture of one selected from the group consisting of C. I. Pigment Orange 43, C. I. Pigment Orange 64 and C. I. Pigment Orange 72, with C. I. Pigment Blue 60, C. I. Pigment Green 7、C. I. Pigment Green 36 and C. I. Pigment Green 58.

33. The device (100) of any one of embodiments 1 to 32, wherein the 2nd composition further comprises a solvent, preferably said solvent is selected from one or more of the members of the group consisting of ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether and propylene glycol monoethyl ether; propylene glycol alkyl ether acetates such as PGMEA, propylene glycol monoethyl ether acetate and propylene glycol monopropyl ether acetate; aromatic hydrocarbons, such as benzene, toluene and xylene; ketones, such as methyl ethyl ketone, acetone, methyl amyl ketone, methyl isobutyl ketone and cyclohexanone; alcohols, such as ethanol, propanol, butanol, hexanol, cyclohexanol, ethylene glycol and glycerin; esters, such as ethyl lactate, ethyl 3-ethoxypropionate, methyl 3-methoxypropionate; and cyclic esters, such as γ-butyrolactone, more preferably said solvent is a combination of propylene glycol alkyl ether acetates or esters, and cyclic esters, such as γ-butyrolactone, preferably the total amount of said solvent based on the total amount of the composition is in the range from 1 wt. % to 99 wt. %, preferably from 5 wt. % to 90 wt. %, even more preferably from 10 wt. % to 80 wt. %, furthermore preferably from 20 wt. % to 70 wt. %.

34. The device (100) of any one of embodiments 1 to 33, wherein the 2nd composition further comprises at least one additive selected from one or more members of the group consisting of a developer dissolution accelerator, a scum remover, an adhesion enhancer, a polymerization inhibitor, an antifoaming agent, a surfactant, a photosensitizing enhancing agent, a crosslinking agent, a curing agent.

35. An optical device (300, 400, 500) containing, essentially consisting of, or consisting of, at least one color conversion device (100) and a functional medium (320, 420, 520) configured to modulate a light or configured to emit light.

36. Method for fabricating a color conversion device (100) comprising, essentially consisting of, or consisting of, at least a $1^{st}$ pixel (161) comprising at least a matrix material (120) containing a light emitting moiety (110), and a bank (150) comprising at least a polymer material, containing at least the following steps, preferably in this sequence, Xi) Providing a $2^{nd}$ composition onto a surface of a supporting medium Xii) Curing the $2^{nd}$ composition, Xiii) Applying photo-patterning to the cured said composition to fabricate bank and a patterned pixel reasion, Xiv) Providing a 1st composition to at least one pixel resion, preferably by ink-jetting, Xv) Curing the 1st composition, preferably said color conversion device (100) further contains a supporting medium (170).

37. The color conversion device (100) obtainable or obtained from the method of embodiment 36.

38. Use of the color conversion device (100) of any one of embodiments 1 to 34 and 37 in an optical device (300) containing at least one functional medium (320, 420, 520) configured to modulate a light or configured to emit light.

Technical Effects of the Invention

Present invention provides one or more of the following effects: improved optical properties of bank, improved compatibility between a bank and a composition containing a light emitting moiety (e.g. QD ink), improved wetting properties and chemical stability towards a composition containing a light emitting moiety, less degradation of the bank structure upon bringing the composition containing a light emitting moiety into contact with the bank, Such degradation may be (partial or complete) dissolution of the bank structure by the QD ink formulation, delamination of the bank structure and/or intermixing of the bank and the QD ink. This would lead to a loss of integrity of the bank structure and/or a loss of the well-defined pixel structure. realizing adequate chemical resistance of the bank so that no degradation is observed upon filling the wells of the bank structure with QD Ink, realizing low curing temperature (e.g. 100° C.) properties of the bank, providing a bank having high resolution and/or excellent light shielding properties. Providing a bank composition configured to be developed even with a low-concentration alkaline developer other than an organic developer and is excellent also in environmental properties, improved homogeneous dispersion of semiconducting light emitting nanoparticles in the composition, improved homogeneous dispersion of scattering particles in the composition, preferably improved homogeneous dispersion of both semiconducting light emitting nanoparticles and scattering particles, more preferably improved homogeneous dispersion of semiconducting light emitting nanoparticles and/or scattering particles without solvent; composition having lower viscosity suitable for inkjet printing, preferably a composition which can keep lower viscosity even if it is mixed with high loading of semiconducting light emitting nanoparticles and/or scattering particles, even more preferably without solvent; composition having lower vaper pressure for large area uniform printing; improved QY/EQE of semiconducting light emitting nanoparticles in the composition, improved QY/EQE of semiconducting light emitting nanoparticles after printing; improved thermal stability; easy printing without clogging at a printing nozzle; easy handling of the composition, improved printing properties; simple fabrication process; improved absorbance of blue light; improved solidity of a later made from the composition after inkjet printing.

The working examples 1-16 below provide descriptions of the present invention, as well as an in-detail description of their fabrication.

WORKING EXAMPLES

Working Example 1: Preparation of Monomer Mixtures 1,6-Hexanediol dimethacrylate (HDDMA) and lauryl acrylate (LA) are stored over molecular sieves 4A. HDDMA is purified by passed through silica gel column prior to use. 4 g of HDDMA and 6 g of LA are mixed in glass vial, thus obtained a monomer mixture. The weight ratio of HDDMA:LA in the monomer mixture is 40:60.

In a same manner as described above, the monomer mixtures of HDDMA:LA (30:70), HDDMA:LA (20:80), NDDA:LA (30:70) are prepared instead of HDDMA:LA (40:60).

Working Example 2: Preparation of QD Monomer Dispersion 10.41 ml of green Cd-free InP based QD solution in toluene (Merck) and 1.02 g of the monomer mixture obtained in working example 1 are mixed in glass flask. Toluene is evaporated under vacuum at 40 deg. C. by rotary evaporator, thus obtained 3.06 g of QD monomer dispersion.

Working Example 3: Preparation of TiO2 Monomer Dispersion 0.425 g of TiO2 solution in n-octane (TOYO color) and 0.51 g of the monomer mixture obtained in example 1 are mixed in glass flask. n-Octane is evaporated under vacuum at 40 deg. C. by rotary evaporator, thus obtained 0.816 g of TiO2 monomer dispersion.

Working Example 4: Preparation of QD Ink

The QD monomer dispersion obtained in working example 2, the TiO2 monomer dispersion obtained in working example 3, 1.12 g of the monomer mixture obtained in working example 1, 0.051 g of photo initiator (Omnirad 819) and 0.041 g of antioxidant (Irganox 1010) are mixed in glass vial. The obtained mixture is agitated by applying ultrasonic and then by magnetic stirring to afford 5 g of the QD ink. The composition of the QD ink is as below.

Comparative Example 1: Preparation of QD Ink (Comparative Example without Diacrylate Monomer)

The QD ink composition is prepared in the same manner as described in working examples 1 to 4 above except for that TBCH=tert-butylcyclohexyl acrylate and TMPTA=trimethylolpropane triacrylate are used with the following concentration in the composition instead of HDDMA.

| QD | TiO2 | monomer mixture (LA:TBCH:TMPTA 27.5:67.5:5) | photo-initiator | anti-oxidant |
|---|---|---|---|---|
| 40 | 5 | 53.2 | 1 | 0.8 |

(wt. %)

Working Example 5: Fabrication of QD Test Cell for EQE and QY Measurement

The QD inks obtained in working example 4 is injected into a text cell with 15 mm gap and comparative example 5 is also injected into a test cell with same condition and photo-cured by irradiating UV light.

Working Example 6: EQE Measurement

EQE measurement is carried out by using integrating sphere equipped with excitation light by optical fiber (CWL: 450 nm) and spectrometer (C9920, Hamamatsu photonics). To detect the photons of the excitation light, air is used as a reference at room temperature.

The number of photons of light emission from the cell towards the integrating sphere is counted by the spectrometer at room temperature.

EQE is calculated by the following calculation Method.

EQE=Photons[Emission light]/Photons[Excitation light]

Wavelength Range for Calculation

Emission: [Green] 480 nm-600 nm, [Red] 560 nm-680 nm

Table 1 shows the EQE measurement results of the QD ink compositions obtained in working example 4.

TABLE 1

| QD | TiO2 | Monomer mixture | Photo initiator | Anti-oxidant | EQE (%) |
|---|---|---|---|---|---|
| 40 | 5 | 53.2 (HDDMA:LA 40:60) | 1 | 0.8 | 25.2% |
| 40 | 5 | 53.2 (HDDMA:LA 30:70) | 1 | 0.8 | 24.8% |
| 40 | 5 | 53.2 (HDDMA:LA 20:80) | 1 | 0.8 | 24.6% |
| 40 | 5 | 53.2 (NDDA:LA 30:70) | 1 | 0.8 | 24.0% |

(wt. %)

The EQE value of the QD ink composition obtained in the comparative example is 22.7.

Reference Example 1: Preparation of QD Ink

QD ink composition A is prepared in the same manner as described in the working examples 1 to 4 except for that the non-purified (meth)acrylate monomers HDDMA:LA (20:80) are used instead of the purified ones.

The EQE value of QD ink composition A measured in the same manner as described in working example 6, is 23.7.

Reference Example 2: Preparation of QD Ink

QD ink composition B is prepared in the same manner as described in the working examples 1 to 4 except for that the non-purified (meth)acrylate monomers HDDMA:LA (40:60) are used instead of the purified ones.

The EQE value of QD ink composition B measured in the same manner as described in working example 6, is 24.6.

Working Example 7: QY Measurement for Dilute QD Monomer Solution

The sample is prepared by diluting 6.5 ml of green QD solution in toluene (Merck) with 10 ml of monomer mixture. Concentration of the sample is 0.13 mg QD/ml monomer solution. QY is measured in a quartz cuvette with 450 nm excitation by using absolute PL quantum yield measurement system (C9920, Hamamatsu photonics).

Significant improvement in QY is observed by increasing HDDMA ratio in monomer mixture. Surprisingly the QY in 50% HDDMA mixture is even higher than original QY.

| Samples | QY (%) |
|---|---|
| Quantum materials in Toluene solution (original) | 85 |
| QD in HDDMA:LA (20:80) | 83 |
| QD in HDDMA:LA (30:70) | 92 |
| QD in HDDMA:LA (40:60) | 92 |
| QD in HDDMA:LA (50:50) | 98 |

Working Example 8: Preparation of QD Ink

The QD ink composition is prepared in the same manner as described in working examples 1 to 4 above except for that TMPTA is also used with LA and HDDMA as mentioned below.

| QD | TiO2 | Monomer mixture (LA:HDDMA:TMPTA 85:10:5) | photo-initiator | anti-oxidant |
|---|---|---|---|---|
| 40 | 5 | 53.2 | 1 | 0.8 |

(wt. %)

Working Example 9: Fabrication of Test Cells and Wiping Test

The QD inks obtained in working example 4 and QD ink obtained in working example 8 are spin coated onto a glass substrates at 400 rpm for 20 sec. and it is photo-cured by irradiating UV light at 380 mJ or at 760 mJ under $N_2$ condition through a quartz glass.

For photo-curing, 395 nm LED flashlight, 6.3 mW/cm$^2$ (FWHM 10 nm) was used.

The surface of the obtained samples is wiped by hand with a clean swab.

Table 2 shows the results of the wiping test.

| QD | TiO2 | Monomer mixture | Photo initiator | Anti-oxidant | 380 mJ | 760 mJ |
|---|---|---|---|---|---|---|
| 40 | 5 | 53.2 (HDDMA:LA 40:60) | 1 | 0.8 | Good | Good |
| 40 | 5 | 53.2 (HDDMA:LA 30:70) | 1 | 0.8 | Good | Good |
| 40 | 5 | 53.2 (HDDMA:LA 20:80) | 1 | 0.8 | Poor (very soft) | Good |
| 40 | 5 | (LA:HDDMA: TMPTA 85:10:5) | 1 | 0.8 | Good | Good |

Working Example 10: QD Ligand Exchange

Cd-free InP based QDs (Merck) are mixed with 7.5 wt. % or 50 wt % of Mono(2-acryloyloxyethyl)succinate (CAS: 50940-49-3 from Tokyo Kasei) based on the total amount of QDs in $CHCl_3$ for 1 hour at 40 deg. C. Cleaning with in $CHCl_3$-MeOH is carried out.

Working Example 11: Preparation of QD Ink

The QD ink composition is prepared in the same manner as described in working examples 1 to 4 above except for that the QDs with Mono(2-acryloyloxyethyl)succinate (Hereafter "AES") obtained from working example 10 are used with LA and HDDMA as mentioned below.

| QD | TiO2 | Monomer mixture (LA:HDDMA 70:30) | photo-initiator | anti-oxidant |
|---|---|---|---|---|
| 40 | 5 | 53.2 | 1 | 0.8 |

No significant viscosity increase for 3 days is observed.

Instead of HDDMA, DPGDA or NDDA can be used preferably.

Instead of AES, known thiol acrylates can also be used.

Working Example 12: Fabrication of QD Test Cell

The QD ink obtained in working example 11 is injected into a text cell with 15 mm gap and photo-cured by irradiating UV light.

The content of AES in the cured QD ink is 3.2 wt. % based on the total amount of cured QD ink in the test cell. The test cell is very clear.

According to the TEM analysis, a smooth layer structure without any void in a cured ink and without any aggregation in the cured ink is observed.

Working Example 13: Preparation of QD Ink and Fabrication of QD Test Cell

The QD ink composition is prepared in the same manner as described in working example except for that no TiO2 particles are used.

And QD test cells are fabricated and EQE is measured in the same manner as described in working example 5 and 6 except for that the QD ink obtained in working example 13 is used.

Below table shows the results of the measurements.

| | PWL(nm) | FWHM(nm) | EQE(%) |
|---|---|---|---|
| AES 7.5 w % Before UV cure | 528 | 34 | 6.9 |
| AES 7.5 w % After UV cure | 530 | 35 | 6.7 |
| AES 50 w % Before UV cure | 529 | 34 | 6.8 |
| AES 50 w % After UV cure | 529 | 34 | 6.4 |

Working Example 14: Preparation of QD Ink Composition

The QD ink composition is prepared in the same manner as described above with using the following materials.

| | |
|---|---|
| Green QD (Merck) | 40.0 wt. % |
| LA | 41.6 wt. % |
| HDDMA | 10.4 wt. % |
| Titanium dioxide (scattering particles) | 6.0 wt. % |
| Phosphine oxide, phenylbis(2,4,6-trimethylbenzoyl) (Omnirad(™) 819) | 1.0 wt % |
| Irganox(™) 1010 | 1.0 wt % |

Working Example 15: Preparation of Bank Composition

The bank composition is prepared with using the following materials.

TABLE 2

| | | |
|---|---|---|
| Alkaline soluble polymer | Acryl polymer A | 6.4 wt % |
| | Acryl polymer B | 2.1 wt % |
| Chemical compound (Monomer) | A-DPH (Shin-Nakamura) | 16.2 wt % |
| Radical Initiator | NCI-831 (Adeka) | 0.26 wt % |
| | Irgacure 784 (BASF) | 0.26 wt % |
| Saccharide | Saccharide A | 7.7 wt % |
| Surfactant | RS-72-K (DIC) | 0.08 wt % |
| Solvent | PGMEA | 51.9 wt % |
| | GBL | 13.0 wt % |
| Colorant | Black Pigment | 2.1 wt % |
| Total | | 100% |

Saccharide A: sucrose ethylene oxide adduct

Acryl polymer B: 2-Propenoic acid, 2-methyl-, polymer with 2-hydroxyethyl 2-methyl-2-propenoate, 2-isocyanatoethyl 2-propenoate and methyl 2-methyl-2-propenoate (Natoco).

Acryl polymer A: acrylic randam polymer made from carbon acid monomer and monomer containing at least one aromatic ring group (Shin-Nakajima).

Working Example 16: Device Fabrication

The obtained bank composition is applied onto a bared glass substrate by spin coating, then the coated glass substrate is prebaked on a hot plate at 100° C. for 90 seconds so as to prepare an average film thickness of 13 μm. Exposure is performed using an i-line exposure machine, and cure baking is performed at 230° C. for 30 min. Then, a development is performed using 0.03% KOH for 60 seconds, and rinsing with deionized pure water is performed for 30 seconds. As a result, a 12 μm bank (C/H) pattern is formed. Finally, sample 1 is obtained.

Then sample 2 is fabricated in the same manner as described above "fabrication of sample 1" except for 100° C. for 30 minutes cure baking condition is applied instead of 230° C. for 30 minutes cure baking condition. Then sample 2 is obtained.

OD Calculation

The transmittance at the wavelength of 400 to 700 nm of sample 1 and sample 2 are measured with using a Spectrophotometer CM-5 (Konica Minolta, Inc.), and it is converted into the OD.

SEM Analysis

Cross Section SEM analysis of the sample 2 is performed. FIG. 6 show the results of the Cross Section SEM analysis.

FT: 11.5 μm, Taper angle: 98 deg. are observed.

According to the Cross Section SEM analysis, the well-defined pixel structure is observed. It also proves that a low curing temperature (e.g. 100° C.) properties of the bank is very good. Further, the bank composition is well developed even with a low-concentration alkaline developer The process conditions and the obtained OD calculation results are shown in Table 3. It is also confirmed by SEM analysis that the patterns of sample 1 and 2 are formed (OK) without any peeling.

TABLE 3

| | |
|---|---|
| Substrate | Bare glass |
| Surface treatment | No surface treatment |
| Coating recipe | 900 rpm/0.1 s, 160 rpm/10 s, 1000 rpm/0.1 s |
| Bake | 100degC., 90 sec. |
| Expo. | 100, 120 140 mJ |
| Dev. | 0.03% KOH, 60 sec |
| rinse | DIW 30 s |
| Cure baking | 230degC.(ref) or 100degC., air, 30 min |
| Film thickness | After dev = 13.0 um/After cure = 12.0 um |
| OD | OD1.96/FT12.0 um (230degC.cure Ref)<br>OD1.81/FT12.0 um (100degC. cure) |

QD Ink Filing Test

Then, the QD ink obtained in working example 14 is injected into the samples 1 and 2 with 12 mm gap and photo-cured by irradiating UV light. The obtained samples 1 and 2 are very clear.

According to the cross section SEM analysis, a smooth layer structure without any void in a cured ink and without any aggregation in the cured ink is observed.

And the compatibility between the bank and the cured ink, and the wetting properties and chemical stability towards the QD ink are both very good.

Figure 7:
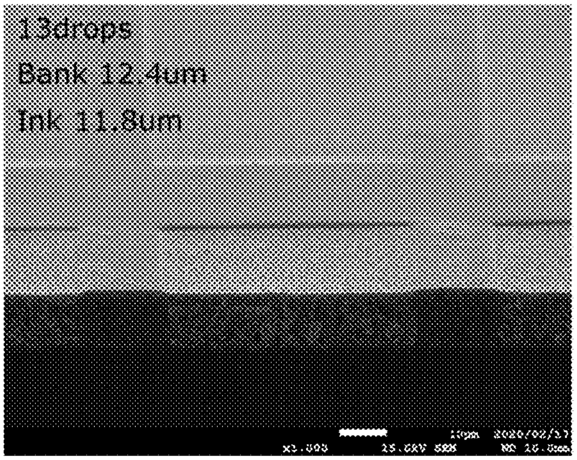
FIG. 7: shows the results of the Cross Section SEM analysis of the samples 1 and 2
Figure 7:
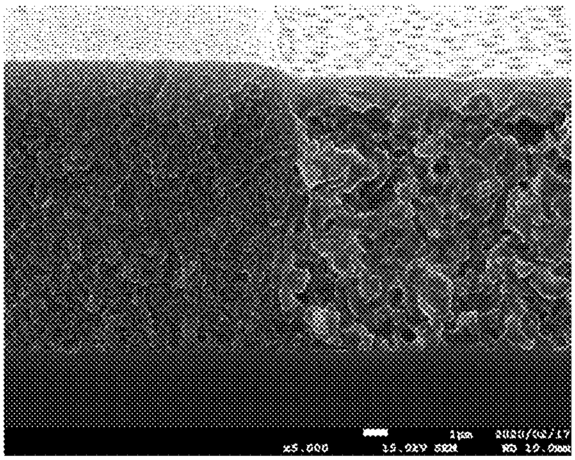

FIG. 7 shows the results of the SEM analysis.

According to the SEM analysis, no dissolution, no delamination of the bank structure by the QD ink, no intermixing of the bank and the QD ink are also observed.

The invention claimed is:

1. A color conversion device comprising at least a first pixel comprising at least a matrix material containing a light emitting moiety, and a bank comprising a polymer material and a saccharide.

2. The device of claim 1, wherein the matrix material comprises a (meth)acrylate polymer.

3. The device of claim 1, wherein the first pixel is a solid layer obtained or obtainable by curing a first composition containing at least one acrylate monomer together with at least one light emitting moiety.

4. The device of claim 1, wherein the polymer material is a thermosetting resin.

5. The device of claim 1, wherein the bank further comprises a surfactant.

6. The device of claim 1, wherein the bank further comprises a nonionic surfactant.

7. The device of claim 1, wherein the saccharide is an oligosaccharide comprising an alkylene oxide having 1 to 6 carbon atoms.

8. The device of claim 1, wherein the bank further comprises a colorant.

9. The device of claim 1, further comprising a second pixel.

10. The device of claim 1, wherein at least one pixel further comprises at least one light scattering particle in the matrix material.

11. The device of claim 1, wherein the first pixel consists of one pixel or two or more sub-pixels configured to emit red-color when irradiated by an excitation light.

12. The device of claim 1, wherein the bank is configured to determine the area of the first pixel and at least a part of the bank is directly contacting to at least a part of the first pixel.

13. The device of claim 1, wherein the bank is photo-lithographically patterned and the first pixel is surrounded by the bank.

14. The device of claim 1, wherein the first pixel is obtained or obtainable from a first composition, or is a cured layer of the first composition, wherein the first composition comprises:

i) at least one (meth)acrylate monomer represented by following chemical formula (I), and ii) another material;

(I)

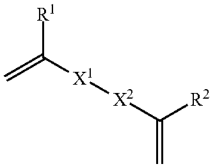

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group; and $R^2$ is a hydrogen atom, halogen atom of Cl, Br, or F, methyl group, alkyl group, aryl group, alkoxy group, ester group, or a carboxylic acid group.

15. The device of claim 1, wherein the bank is obtained or obtainable from a second composition, or is a cured layer of the second composition, wherein the second composition comprises:

(I) an alkaline soluble polymer, (II) a polymerization initiator, and (III) a chemical compound containing at least two (meth) acryloyloxy groups.

16. An optical device comprising at least one color conversion device of claim 1 and a functional medium configured to modulate a light or configured to emit light.

17. A method for fabricating the color conversion device of claim 1, the method comprising at least the following steps:

providing a second composition onto a surface of a supporting medium, curing the second composition, applying photo-patterning to the cured composition to fabricate a bank and a patterned pixel region, providing a first composition to at least one pixel region, and curing the first composition.

18. The color conversion device obtainable or obtained from the method of claim 17.

19. The device of claim 14, wherein $X^1$ is

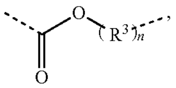

wherein n is 0 or 1;

$X^2$ is

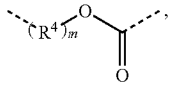

wherein m is 0 or 1;

wherein $R^3$ is a straight alkylene chain or alkoxylene chain having 1 to 25 carbon atoms, a cycloalkane having 3 to 25 carbon atoms or an alkyl group having 3 to 25 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an alkyl group having 3 to 25 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$; and $R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents Ra here may also form a mono- or polycyclic, aliphatic, aromatic or heteroaromatic ring system with one another.

20. The device of claim 19, wherein at least m or n is 1, $R^3$ is a straight alkylene chain or alkoxylene chain having 1 to 15 carbon atoms, and $R^4$ is a straight alkylene chain or alkoxylene chain having 1 to 15 carbon atoms.

* * * * *